(12) United States Patent
Park et al.

(10) Patent No.: US 9,064,829 B2
(45) Date of Patent: Jun. 23, 2015

(54) ORGANIC LIGHT EMITTING DISPLAY DEVICE

(71) Applicant: LG DISPLAY CO., LTD., Seoul (KR)

(72) Inventors: Kwangmo Park, Uijeongbu-si (KR); Jongsik Shim, Goyang-si (KR); Hyojin Park, Yeosu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/496,459

(22) Filed: Sep. 25, 2014

(65) Prior Publication Data

US 2015/0090985 A1 Apr. 2, 2015

(30) Foreign Application Priority Data

Sep. 30, 2013 (KR) .................. 10-2013-0116844

(51) Int. Cl.
*H01L 27/30* (2006.01)
*H01L 27/32* (2006.01)
*H01L 27/15* (2006.01)
*H01L 51/00* (2006.01)

(52) U.S. Cl.
CPC .......... *H01L 27/3246* (2013.01); *H01L 27/322* (2013.01); *H01L 27/3213* (2013.01); *H01L 27/3218* (2013.01)

(58) Field of Classification Search
CPC ...... H01L 25/048; H01L 27/288; H01L 27/30; H01L 27/32; H01L 51/0032; H01L 51/50; H01L 2227/32; H01L 2251/50
See application file for complete search history.

(56) References Cited

U.S. PATENT DOCUMENTS

| 2005/0236979 | A1 | 10/2005 | Kwak et al. | |
|---|---|---|---|---|
| 2013/0069045 | A1 | 3/2013 | Otsuki et al. | |
| 2014/0339509 | A1* | 11/2014 | Choi et al. | 257/40 |

FOREIGN PATENT DOCUMENTS

| EP | 2312559 A1 | 4/2011 |
|---|---|---|
| EP | 2816627 A1 | 12/2014 |
| JP | 2011002689 A | 1/2011 |

* cited by examiner

*Primary Examiner* — Hoai V Pham
(74) *Attorney, Agent, or Firm* — McKenna Long & Aldridge LLP

(57) ABSTRACT

An organic light-emitting display device is disclosed. The organic light emitting display device includes a display panel including sub-pixels emitting light of at least three colors, and a driver supplying a driving signal to the display panel, wherein each of the sub-pixels emitting at least three colors includes an opening region emitting its own color and a light-emitting participation region additionally emitting the same color as or different color from the its own color.

18 Claims, 17 Drawing Sheets

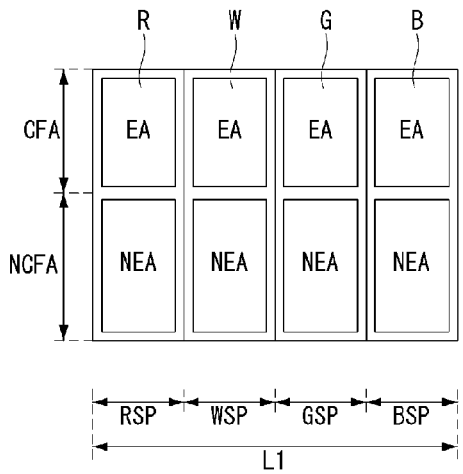
Fig. 3A
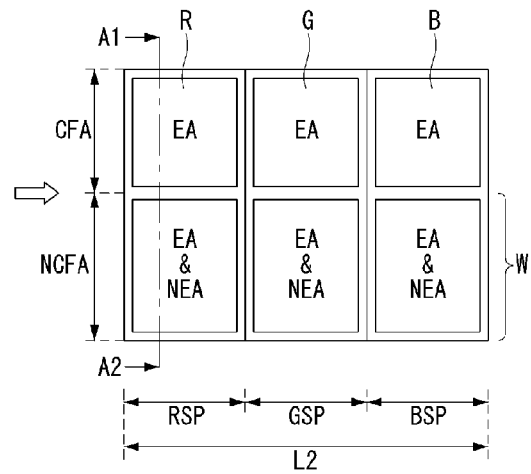
Fig. 3B
RELATED ART
Fig. 4
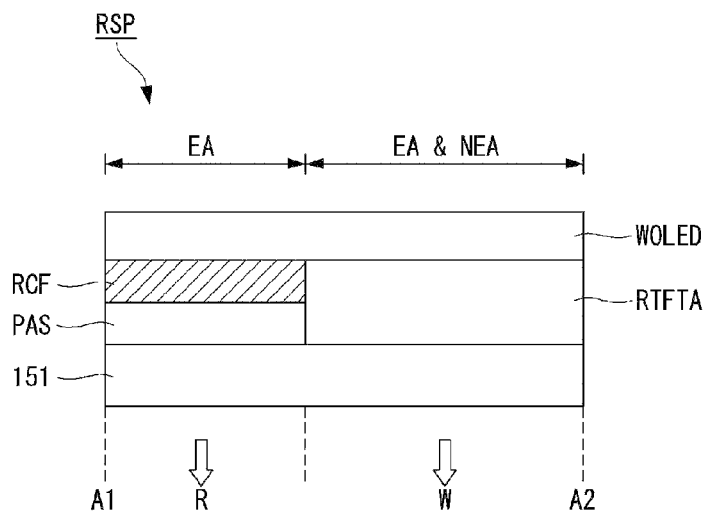

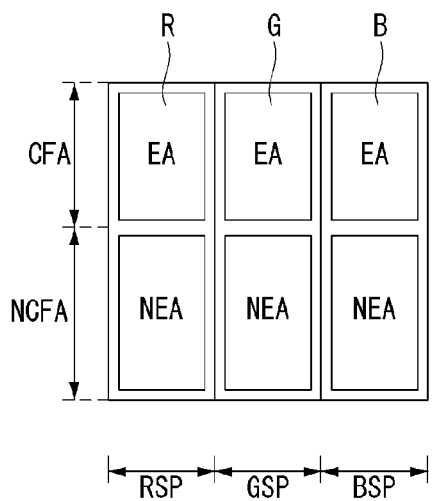
Fig. 7A
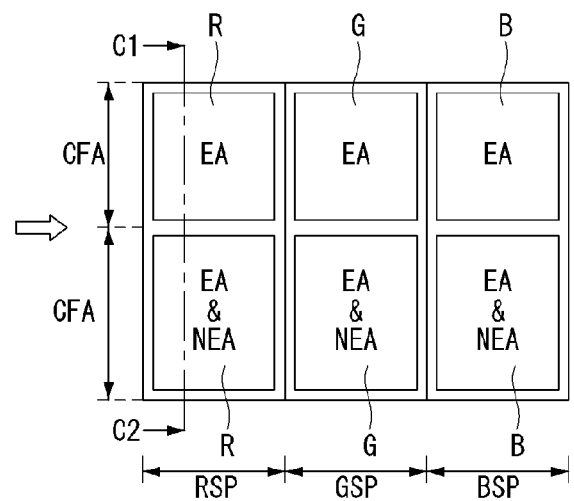
Fig. 7B
RELATED ART
Fig. 8
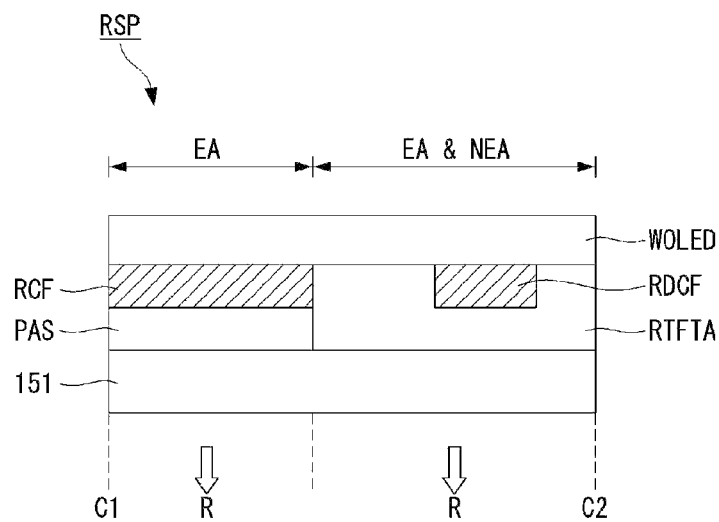

Fig. 13
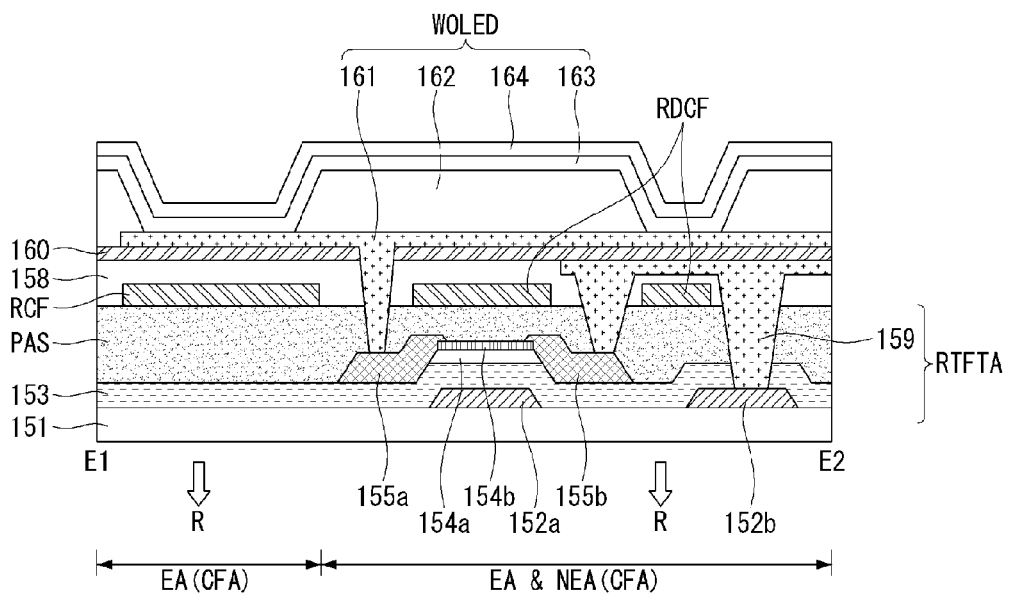
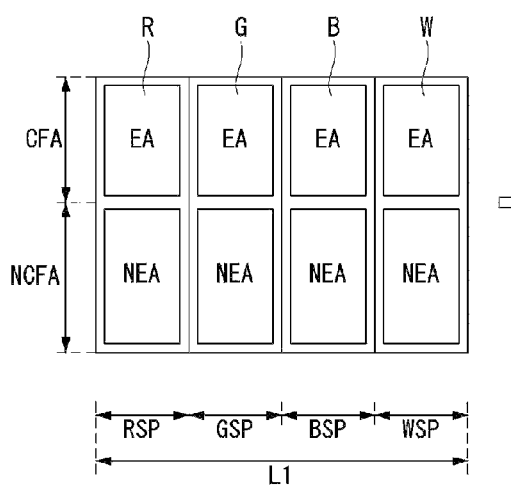
Fig. 14A
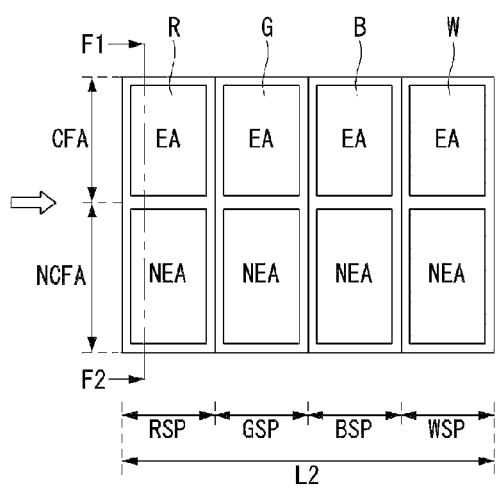
Fig. 14B
RELATED ART

ORGANIC LIGHT EMITTING DISPLAY DEVICE

CROSS-REFERENCE TO RELATED APPLICATION

This application claims the benefit of Korean Patent Application No. 10-2013-0116844 filed on Sep. 30, 2013, which is incorporated herein by reference for all purposes as if fully set forth herein.

BACKGROUND

1. Field of the Disclosure

Embodiments of the invention relates to an organic light-emitting display device.

2. Description of the Related Art

An organic electro-luminescence element used for an organic light-emitting display device is a self-light-emitting element having a light-emitting layer formed between two electrodes positioned on a substrate. The organic light-emitting display device can be categorized into a top-emission type, a bottom-emission type, and a dual-emission type according to a direction in which light is emitted.

In the organic light-emitting display device, when a scan signal, a data signal, and power are supplied to a plurality of sub-pixels disposed in a matrix form, selected sub-pixels may emit light to display an image.

Each of the sub-pixels on a display panel of the organic light-emitting display device includes a transistor unit including a switching transistor, a driving transistor, and a capacitor, and an organic light-emitting diode (OLED) including a lower electrode connected to the driving transistor, an organic light-emitting layer, and an upper electrode.

The organic light-emitting layer of the organic light-emitting diode corresponds to a layer from which the light is emitted. The light emitted from the organic light-emitting diode is emitted through an opening region not blocked by device wiring or other features. That is, an aperture ratio of each sub-pixel depends on an area that defines the opening region.

However, a region occupied by the transistor unit is wider than a region occupied by the organic light-emitting diode. Therefore, a non-opening region necessarily occupies a region wider than the opening region. For example, in the case that the sub-pixels are configured as the bottom-emission type, the non-opening region in which the transistor unit is positioned is inevitably covered with an electrode, a wire, and the like. As a result, in the related art, the non-opening region in which the transistor unit is positioned was covered.

The problems as described above may be more difficult to improve in the case that when the display panel is configured with a high resolution or when a compensating circuit should be provided in other sub-pixel. Therefore, with the organic light-emitting display device according to the related art, there is a need for a method capable of extending the region where the light emitted from the organic light-emitting layer is emitted in order to implement a high resolution.

SUMMARY

An aspect of the present disclosure provides an organic light emitting display device including: a display panel including sub-pixels emitting light of at least three colors; and a driver supplying a driving signal to the display panel, wherein each of the sub-pixels emitting at least three colors includes an opening region emitting its own color and a light-emitting participation region additionally emitting the same color as or different color from the its own color.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawings:

FIG. 3A is a schematic plan diagram of a sub-pixel according to the related art and FIG. 3B is a schematic plan diagram of a sub-pixel according to a first embodiment of the present invention;

FIG. 4 is a cross-sectional diagram of a region taken along line A1-A2 of FIG. 3B;

FIG. 7A is a schematic plan diagram of a sub-pixel according to the related art and FIG. 7B is a schematic plan configuration diagram of a sub-pixel according to a second embodiment of the present invention;

FIG. 8 is a cross-sectional diagram of a region taken along line C1-C2 of FIG. 7B;

FIG. 13 is a second cross-sectional diagram of a region taken along line E1-E2 of FIG. 11;

FIG. 14A is a schematic plan diagram of a sub-pixel according to the related art and FIG. 14B is a schematic plan diagram of a sub-pixel according to a fourth exemplary embodiment of the present invention;

DETAILED DESCRIPTION OF EMBODIMENTS

Reference will now be made in detail embodiments of the invention examples of which are illustrated in the accompanying drawings.

Hereinafter, embodiments of the present invention will be described in detail with reference to the accompanying drawings.

Figure 1:
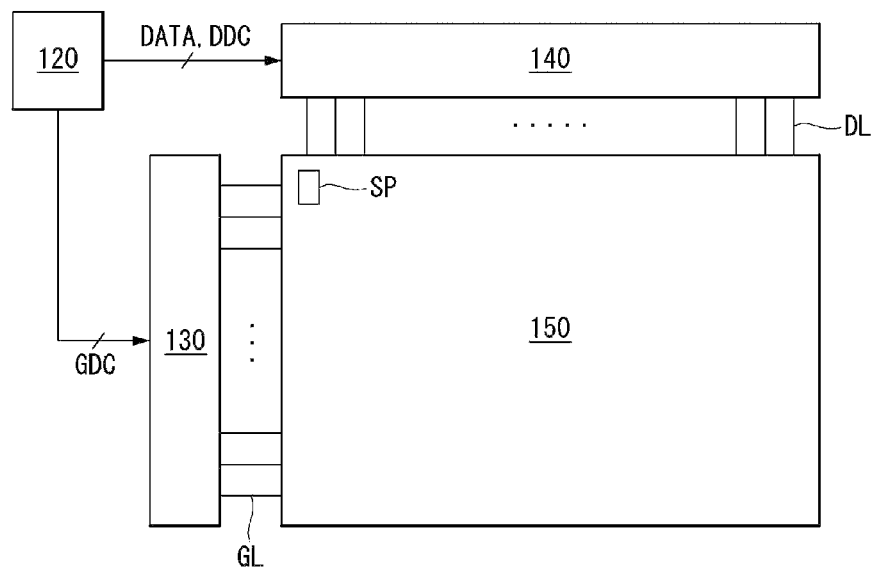
FIG. 1 is a block diagram schematically illustrating an organic light-emitting display device according to a first exemplary embodiment of the present invention.
Figure 2:
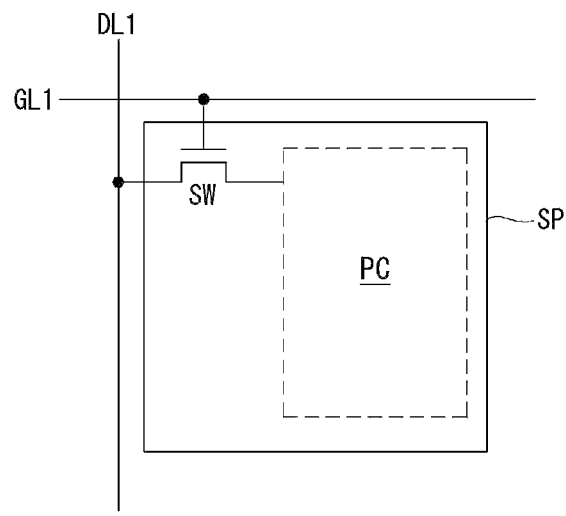
FIG. 2 is a diagram of a sub-pixel illustrated in FIG. 1.

FIG. 1 is a block diagram schematically illustrating an organic light-emitting display device according to a first exemplary embodiment of the present invention and FIG. 2 is a diagram of an example sub-pixel illustrated in FIG. 1.

As illustrated in FIG. 1, the organic light-emitting display device according to the first exemplary embodiment includes a timing controller 120, a gate driver 130, a data driver 140, and a display panel 150.

The timing controller 120 outputs a gate timing control signal GDC for controlling an operation timing of the gate driver 130 and a data timing control signal DDC for controlling an operation timing of the data driver 140. The timing controller 120 supplies a data signal DATA together with the data timing control signal DDC to the data driver 140.

The data driver 140 samples and latches the data signal DATA in response to the data timing control signal DDC supplied from the timing controller 120 and converts and outputs the sampled and latched data signal DATA into a gamma reference voltage. The data driver 140, which is an integrated circuit (IC), may be mounted on the display panel 150 or on an external substrate connected to the display panel 150. The data driver 140 supplies the data signal DATA to multiple sub-pixels SP included in the display panel 150 through data lines DL.

The data driver 130 outputs a gate signal while shifting a level of the gate voltage in response to the gate timing control signal GDC supplied from the timing controller 120. The gate driver 130, which is an integrated circuit (IC), may be mounted on the display panel 150 or on an external substrate connected to the display panel 150. In addition, the gate driver 130 may be formed on the display panel in a gate in panel (GIP) type. The gate driver 130 supplies the gate signal to the sub-pixels SP included in the display panel 150 through gate lines GL.

The display panel 150 displays the image corresponding to a driving signal such as the gate signal supplied from the gate driver 130 and the data signal DATA supplied from the data driver 140. The display panel 150 is provided therein with the sub-pixels SP displaying the image. The sub-pixels SP may be a bottom-emission type.

Referring to FIG. 2, a sub-pixel includes a switching transistor SW connected to a gate line GL1 and a data line DL1, and a pixel circuit PC operating in response to the data signal DATA supplied corresponding to the scan signal supplied through the switching transistor SW. The pixel circuit PC may include a driving transistor, a capacitor, and an organic light-emitting diode (OLED). The switching transistor SW, the driving transistor, and the capacitor are included in the transistor unit and the organic light-emitting diode is included in a light-emitting unit.

The sub-pixel SP can be configured as a 2-transistor-1-capacitor (2T1C) structure including the switching transistor SW, the driving transistor, the capacitor, and the organic light-emitting diode. However, when a compensating circuit is added in the pixel circuit PC, the sub-pixel SP can be configured as structures 3T1C, 4T2C, 5T2C, or the like. The compensating circuit, which is a circuit compensating a threshold voltage of the driving transistor or the organic light-emitting diode, is configured with a transistor, a capacitor, and the like.

Hereinafter, the organic light-emitting display device according to the first exemplary embodiment of the present invention will be described in detail.

FIG. 3A is a schematic plan diagram of a sub-pixel according to the related art and FIG. 3B is a schematic plan diagram of a sub-pixel according to a first exemplary embodiment of the present invention. FIG. 4 is a cross-sectional diagram of a region taken along line A1-A2 of FIG. 3B.

As illustrated in FIG. 3A, the display panel according to the related art is includes R, W, G, and B (red, white, green, and blue) sub-pixels RSP, WSP, GSP, and BSP in one pixel. Each of the R, W, G, and B sub-pixels RSP, WSP, GSP, and BSP includes an opening region EA at an upper side and a non-opening region NEA at a lower side.

In the opening region EA, a light-emitting unit and a color filter are formed, and in the non-opening region NEA, a transistor unit is formed. The light-emitting unit emits white light and the white light is converted into red (R), green (G), and blue (B) light by color filters. Therefore, the opening region EA may correspond to a color filter forming region CFA, and the non-opening region NEA may correspond to a color filter non-forming region NCFA. However, in the case of the W sub-pixel WSP, the white light may be emitted as it is, such that the color filter is omitted.

The pixel structure according to the related art implements a display image using the R, W, G, and B sub-pixels RSP, WSP, GSP, and BSP. However, the pixel structure according to the related art forms the R, W, G, and B sub-pixels RSP, WSP, GSP, and BSP in a limited space, such that the aperture ratio may be low and it may be difficult to implement a high resolution.

As illustrated in FIG. 3B, the display panel according to a first exemplary embodiment includes R, G, and B sub-pixels RSP, GSP, and BSP in one pixel. Each of the R, G, and B sub-pixels RSP, GSP, and BSP may include an opening region EA at an upper side and a light-emitting region EA & NEA in which the opening region and the non-opening region are combined with each other at a lower side.

That is, the pixel structure as illustrated in FIG. 3B has one pixel with R, G, and B sub-pixels RSP, GSP, and BSP and is configured so that the region corresponding to the non-opening region may emit light. Here, the light-emitting region EA & NEA of each of the sub pixels RSP, GSP, and BSP emits white light.

The opening region EA of each of the R, G, and B sub-pixels RSP, GSP, and BSP may include a color filter, and the light-emitting region EA & NEA may include a light-emitting unit and a transistor unit. The light-emitting unit emits white light and the white light is converted into red (R), green (G), and blue (B) light by a color filter. Therefore, because the color filter converting white (W) light into the red (R), the green (G), and the blue (B) light is required in the opening region EA, the opening region EA corresponds to a color filter forming region CFA. Because the white (W) light is emitted as it is in the light-emitting region EA & NEA, the light-emitting region EA & NEA corresponds to a color filter non-forming region NCFA where the color filter is omitted.

As illustrated in FIG. 3B, the light-emitting region EA & NEA emitting white (W) light may be included in all the R, G, and B sub-pixels RSP, GSP, and BSP or only in any one of R, G, and B sub-pixels. In this case, L2 is a length along a horizontal axis of the pixel and may be smaller than L1, a length along a horizontal axis of the pixel according to the related art. But, the lengths L2 and L1 may also be equal to each other according to the display panel resolution. If the pixel structure is as described in FIG. 3B above, the aperture ratio can be increased, thereby making it possible to implement a higher resolution.

The cross-sectional structure based on the R sub-pixel RSP of FIG. 3B will be described with reference to FIG. 4.

A protection layer PAS, an R color filter RCF, and a portion of white organic light-emitting diode WOLED are formed on a lower substrate 151 and correspond to the opening region EA. On the other hand, an R transistor unit RTFTA and a portion of the white organic light-emitting diode WOLED are formed on a lower substrate 151 and correspond to the light-emitting region EA & NEA. As can be appreciated from the cross-section illustrated in FIG. 4, the white organic light-emitting diode WOLED extends to the light-emitting region EA & NEA together with the opening region EA. In the case of the white light emitted from the white organic light-emitting diode WOLED, in the opening region EA, the white light is converted into red (R) light by the R color filter RCF to emit the red (R) light through the substrate 151. In the light-emitting region EA & NEA, the white light is emitted as unfiltered.

Hereinafter, the first exemplary embodiment will be described in detail with reference to a schematic plan layout diagram of the sub-pixels.

Figure 5:
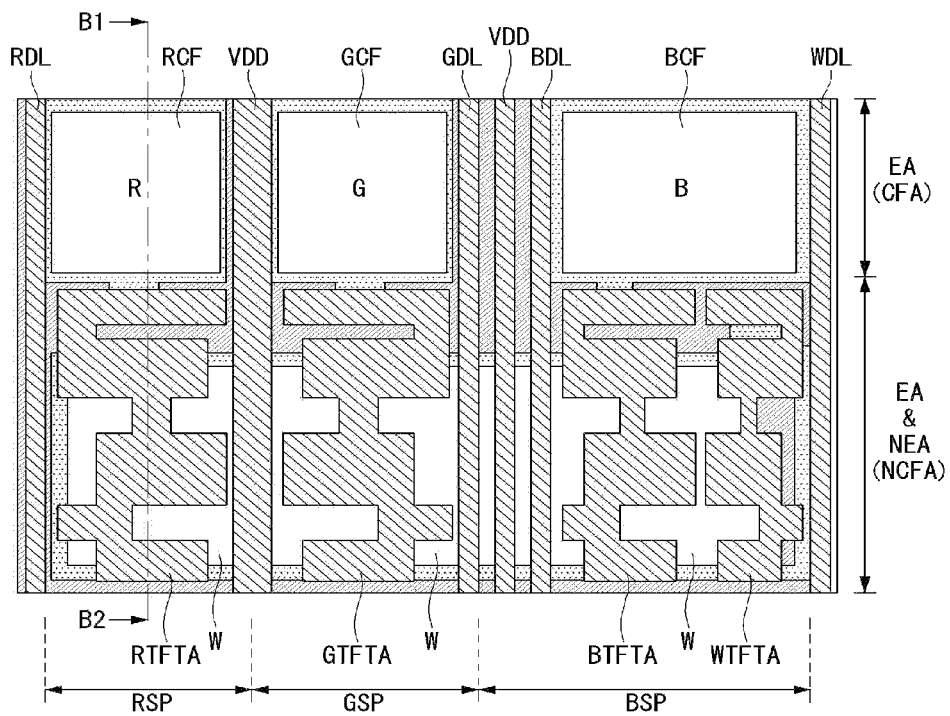
FIG. 5 is a schematic plan layout diagram of a sub-pixel according to a first embodiment of the present invention.
Figure 6:
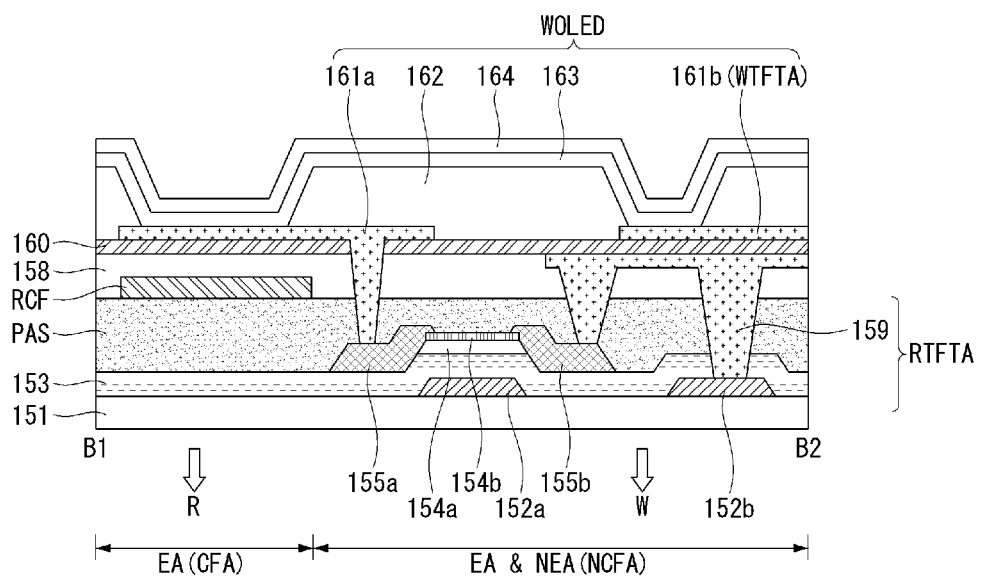
FIG. 6 is a cross-sectional diagram of a region taken along line B1-B2 of FIG. 5.

FIG. 5 is a schematic plan layout diagram of a pixel according to a first exemplary embodiment and FIG. 6 is a cross-sectional diagram of a region taken along line B1-B2 of FIG. 5.

As illustrated in FIG. 5, the R sub-pixel RSP includes an R data line RDL at one side (e.g.: left side) and a power supply wiring VDD is at the other side (e.g.: right side). The G sub-pixel GSP includes the power supply wiring VDD at one side (e.g.: left side) and a G data line GDL at the other side (e.g.: right side). The B sub-pixel BSP includes a B data line BDL at one side (e.g.: left side) and a W data line WDL at the other side (e.g.: right side). The power supply wiring VDD is between the G data line GDL and the B data line BDL.

The R, G, and B color filters RCF, GCF, and BCF are formed in the opening regions EA of the R, G, and B sub-pixels RSP, GSP, and BSP, respectively. The red (R), the green (G), and the blue (B) light are emitted from the opening regions EA of the R, G, and B sub-pixels RSP, GSP, and BSP, respectively.

The R, G, and B transistor units RTFTA, GTFTA, and BTFTA are formed in the light-emitting regions EA & NEA of the R, G, and B sub-pixels RSP, GSP, and BSP, respectively. However, the W transistor unit WTFTA is also included in one among the R, G, and B transistor units RTFTA, GTFTA, and BTFTA. That is, although the FIG. 5 illustrates a case in which the B transistor unit BTFTA and the W transistor unit WTFTA are included in the light-emitting region EA & NEA of the B sub-pixel BSP as an example, the W transistor unit WTFTA may be formed in the light-emitting region EA & NEA of any of the sub-pixels. In this case, the W transistor unit WTFTA corresponds to a second (dummy) transistor unit.

The W transistor unit WTFTA drives the white organic light-emitting diode WOLED formed in the light-emitting region EA & NEA with data from a data signal supplied through the W data line WDL and a gate signal supplied through a gate line (not illustrated). That is, the white organic light-emitting diode WOLED formed in the light-emitting region EA & NEA is separately formed from the white organic light-emitting diode WOLED formed in the opening region EA of the R, G, and B sub-pixels RSP, GSP, and BSP.

Further, the white organic light-emitting diode WOLED formed in the light-emitting region EA & NEA emits light corresponding to an operation of the W transistor unit WTFTA. Therefore, the light-emitting region EA & NEA serves as an independent W sub-pixel WSP.

light-emittingHowever, when the white organic light-emitting diode WOLED of the RGB sub-pixels RSP, GSP, and BSP extends to the light-emitting region EA & NEA, each of the sub pixels RSP, GSP, and BSP may emit the white light corresponding to the operation of the R, G, and B transistor units RTFTA, GTFTA, and BTFTA. In this case, since the W data line WDL and the W transistor unit WTFTA are not required, they are omitted (or removed) from the light-emitting region EA & NEA.

In the case in which the structure of each of the R, G, and B sub pixels RSP, GSP, and BSP is configured as described above, when the red (R) light is emitted through the opening region EA of the R sub-pixel RSP, the light-emitting region EA & NEA emits white (W) light. When the green (G) light is emitted through the opening region EA of the G sub-pixel GSP, the light-emitting region EA & NEA emits white (W) light. When the blue (B) light is emitted through the opening region EA of the B sub-pixel BSP, the light-emitting region EA & NEA emits white (W) light.

The cross-sectional structure based on the R sub-pixel RSP of FIG. 5 will be described with reference to FIG. 6.

A gate electrode 152a and a gate metal 152b are formed on the lower substrate 151 in the light-emitting region EA & NEA. A first insulating layer 153 covers the gate electrode 152a and the gate metal 152b on the lower substrate 151. A semiconductor layer 154a is formed on the first insulating layer 153 in the light-emitting region EA & NEA and a light blocking layer 154b is formed on the semiconductor layer 154a.

A first electrode 155a and a second electrode 155b each make contact with one side of the semiconductor layer 154a on the first insulating layer 153 of the light-emitting region EA & NEA. As a result, the R transistor unit RTFTA is formed on the lower substrate 151 of the light-emitting region EA & NEA.

A protection layer PAS covers the first and second electrodes 155a and 155b on the lower substrate 151. The R color filter RCF is formed on the protection layer PAS of the opening region EA. A second insulating layer 158 is formed on the protection layer PAS. The second insulating layer 158 has a first contact hole exposing the second electrode 155b and the gate metal 152b of the light-emitting region EA & NEA.

A contact electrode 159 for electrically connecting the second electrode 155b to the gate metal 152b is formed on the protection layer PAS of the light-emitting region EA & NEA. A third insulating layer 160 is formed on the second insulating layer 158. The third insulating layer 160 has a second contact hole exposing the first electrode 155a.

A first lower electrode 161a electrically connected to the first electrode 155a is formed on the third insulating layer 160 in the opening region EA. A second lower electrode 161b electrically insulated from the first lower electrode 161a of the opening region EA is formed on the third insulating layer 160 of the light-emitting region EA & NEA. The lower electrode 161b of the light-emitting region EA & NEA is electrically connected to the first electrode of the W transistor unit WTFTA.

A bank layer 162 is formed on the lower electrodes 161a and 161b of the opening region EA and the light-emitting region EA & NEA. The bank layer 162 exposes portions of the lower electrodes 161a and 161b of the opening region EA and the light-emitting region EA & NEA, respectively.

The exposed portion of the second lower electrode 161b of the light-emitting region EA & NEA corresponds to the opening region and the light-emitting region. Therefore, light-emitting efficiency may be enhanced enough in a region in which the light is emitted without covering the electrode, the wiring, and the like on the lower portion. Thus, during design layout of the sub-pixel, it is preferable that the wide region which is not covered by the electrode, the wiring, or the like is maintained and the bank layer 162 is patterned so that a portion of the second lower electrode 161b of the light-emitting region EA & NEA is exposed.

An organic light-emitting layer 163 is formed on the lower electrodes 161a and 161b of the opening region EA and the light-emitting region EA & NEA. An upper electrode 164 is formed on the organic light-emitting layer 163 of the opening region EA and the light-emitting region EA & NEA. In this way, a white organic light-emitting diode WOLED is each formed in the opening region EA and the light-emitting region EA & NEA.

As seen in the figure, the white organic light-emitting diode WOLED extends from the opening region EA to the light-emitting region EA & NEA to emit light by the operation of the R transistor unit RTFTA.

FIG. 7A is a schematic plan diagram of a sub-pixel according to the related art and FIG. 7B is a schematic plan diagram of a sub-pixel according to a second exemplary embodiment of the present invention. FIG. 8 is a cross-sectional diagram taken along line C1-C2 of FIG. 7.

As illustrated in FIG. 7A, the display panel according to the related art is implemented so that R, G, and B sub-pixels RSP, GSP, and BSP constitute one pixel. Each of the R, G, and B sub-pixels RSP, GSP, and BSP includes an opening region EA at an upper side and a non-opening region NEA at a lower side.

In the opening region EA, a light-emitting unit and a color filter are formed, and in the non-opening region NEA, a transistor unit is formed. The light-emitting unit emits white light and the white light is converted into red (R), green (G), and blue (B) light by the color filter. Therefore, the opening region EA may correspond to a color filter forming region CFA, and the non-opening region NEA may correspond to a color filter non-forming region NCFA.

The pixel structure according to the related art implements the image using the R, G, and B sub-pixels RSP, GSP, and BSP. However, the pixel structure according to the related art should forms the RGB sub-pixels RSP, GSP, and BSP on a limited space, such that the aperture ratio may be low and it may be difficult to implement a high resolution.

As illustrated in FIG. 7B, the display panel according to a second exemplary embodiment is implemented so that R, G, and B sub-pixels RSP, GSP, and BSP constitute one pixel. Each of the R, G, and B sub-pixels RSP, GSP, and BSP includes an opening region EA at an upper side and a light-emitting region EA & NEA in which the opening region and the non-opening region are combined with each other at a lower side.

That is, the pixel structure as illustrated in FIG. 7B has one pixel using the R. G, and B sub-pixels RSP, GSP, and BSP and is configured so that the region corresponding to the non-opening region may emit light. The red (R), the green (G), and the blue (B) light is emitted in the light-emitting region EA & NEA of the R, G, and B sub-pixels RSP, GSP, and BSP, respectively.

The opening region EA of each of the R, G, and B sub-pixels RSP, GSP, and BSP includes a light-emitting unit and a color filter and the light-emitting region EA & NEA includes the light-emitting unit, a dummy color filter, and a transistor unit. The light-emitting unit emits white light and the white light is converted into red (R), green (G), and blue (B) light by the color filters. Therefore, since the color filter converting the white (W) light into the red (R), the green (G), and the blue (B) light is required in the opening region EA and the light-emitting region EA & NEA, the opening region EA and the light-emitting region EA & NEA correspond to a color filter forming region CFA.

The cross-sectional structure based on the R sub-pixel RSP of FIG. 7B will be described with reference to FIG. 8.

FIG. 8 illustrates a protection layer PAS, an R color filter RCF, and a white organic light-emitting diode WOLED formed on a lower substrate 151 which corresponds to the opening region EA. Also, an R transistor unit RTFTA, a second R (dummy) color filter RDCF, and the white organic light-emitting diode WOLED are formed on a lower substrate 151 which corresponds to the light-emitting region EA & NEA.

As can be appreciated from the cross-section illustrated in FIG. 8, the white organic light-emitting diode WOLED extends between the light-emitting region EA & NEA and the opening region EA. White light emitted from the white organic light-emitting diode WOLED, in the opening region EA and the light-emitting region EA & NEA, is converted into red (R) light by the R color filter RCF and the R dummy color filter RDCF.

Hereinafter, the second exemplary embodiment will be further described in detail with reference to schematic plan layout diagrams of the sub-pixels.

Figure 9:
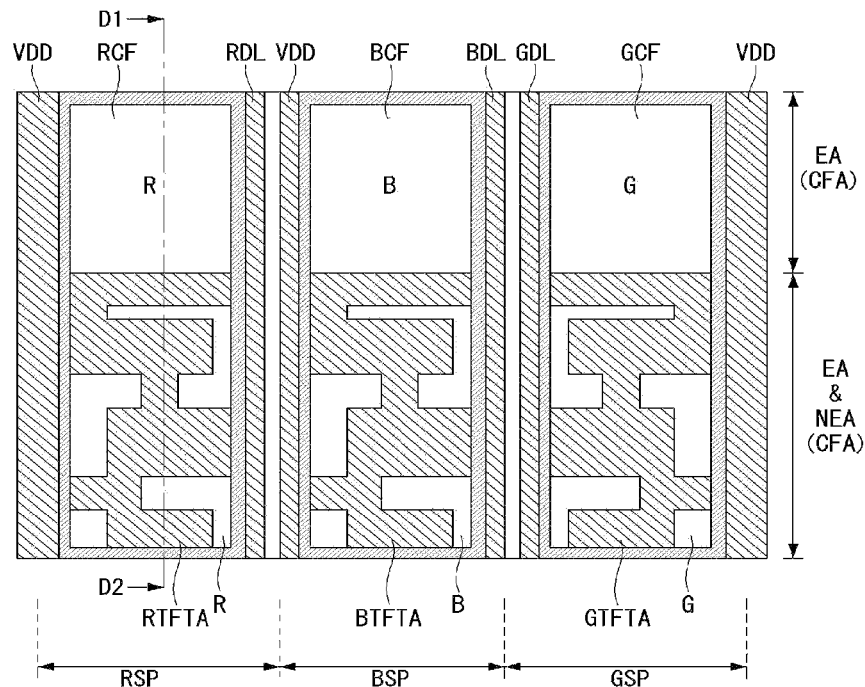
FIG. 9 is a schematic plan layout diagram of a sub-pixel according to a second embodiment of the present invention.
Figure 10:
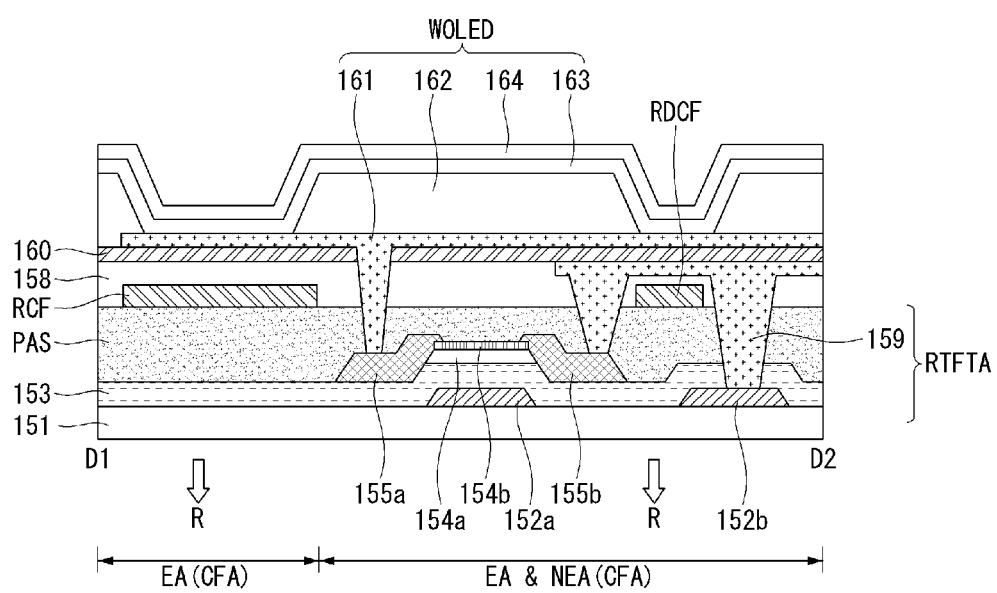
FIG. 10 is a cross-sectional diagram of a region taken along line D1-D2 of FIG. 9.

FIG. 9 is a schematic plan layout diagram of a sub-pixel according to the second exemplary embodiment and FIG. 10 is a cross-sectional diagram of a region taken along line D1-D2 of FIG. 9.

As illustrated in FIG. 9, the R sub-pixel RSP includes a power supply wiring VDD at one side (e.g.: left side) and an R data line RDL at another side (e.g.: right side). The B sub-pixel BSP includes the power supply wiring VDD at one side (e.g.: left side) and a B data line BDL at another side (e.g.: right side). The G sub-pixel GSP includes a G data line GDL at one side (e.g.: left side) thereof and the power supply wiring VDD at another side (e.g.: right side).

The R, B, and G color filters RCF, BCF, and GCF are formed in the opening regions EA of the R, B, and G sub-pixels RSP, BSP, and GSP, respectively. The red (R), the blue (B), and the green (G) light are emitted in the opening regions EA of the R, B, and G sub-pixels RSP, BSP, and GSP, respectively.

The R, B, and G transistor units RTFTA, BTFTA, and GTFTA are formed in the light-emitting regions EA & NEA of the R, B, and G sub-pixels RSP, BSP, and GSP, respectively. The second RBG (dummy) color filters RFCF, BFCF, and GFCF are formed in the light-emitting regions EA & NEA of the R, B, and G sub-pixels RSP, BSP, and GSP, respectively.

That is, the white organic light-emitting diode WOLED formed in the light-emitting region EA & NEA extends from the white organic light-emitting diode WOLED formed in the opening region EA of the R, B, and G sub-pixels RSP, BSP, and GSP. The white organic light-emitting diode WOLED emits light corresponding to the operation of the R, B, and G transistor units RTFTA, BTFTA, and GTFTA of the R, B, and G sub-pixels RSP, BSP, and GSP.

In the case in which the structure of each of the R, B, and G sub pixels RSP, BSP, and GSP is configured as described above, when the red (R) light is emitted through the opening region EA of the R sub-pixel RSP, the light-emitting region EA & NEA also emits red (R) light, when the blue (B) light is emitted through the opening region EA of the B sub-pixel BSP, the light-emitting region EA & NEA also emits blue (B) light, and when the green (G) light is emitted through the opening region EA of the G sub-pixel GSP, the light-emitting region EA & NEA also emits green (G) light.

The cross-sectional structure based on the R sub-pixel RSP of FIG. 9 will be described with reference to FIG. 10. FIG. 10 illustrates many of the same elements described with respect to FIG. 6 and a description will be omitted for brevity.

A protection layer PAS covers the first and second electrodes 155a and 155b on the lower substrate 151. The R color filter RCF is formed on the protection layer PAS in the opening region EA and the R dummy color filter RDCF is formed on the protection layer PAS in the light-emitting region EA & NEA. A second insulating layer 158 is formed on the protection layer PAS. The second insulating layer 158 has contact holes exposing the second electrode 155b and the gate metal 152b of the light-emitting region EA & NEA.

A lower electrode 161 that is electrically connected to the first electrode 155a and extends to the light-emitting region EA & NEA is formed on the third insulating layer 160. Here, in the case of the second opening in the light-emitting region EA & NEA, since the electrode or the wiring formed at the lower portion of the R transistor unit RTFTA should be considered, a plurality of second openings may be formed in only a portion of the light-emitting region EA & NEA. Therefore, the number of the second openings of the light-emitting region EA & NEA may be N.

As seen in the figure, the white organic light-emitting diode WOLED extends from the opening region EA to the light-emitting region EA & NEA to emit the same red R light by the operation of the R transistor unit RTFTA.

Figure 11:
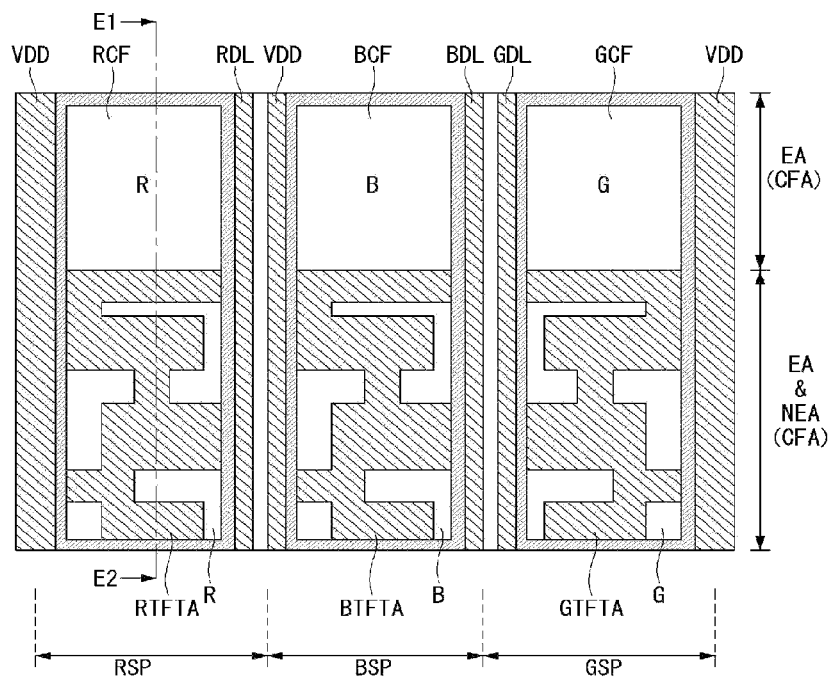
FIG. 11 is a schematic plan layout diagram of a sub-pixel according to a third exemplary embodiment of the present invention.
Figure 12:
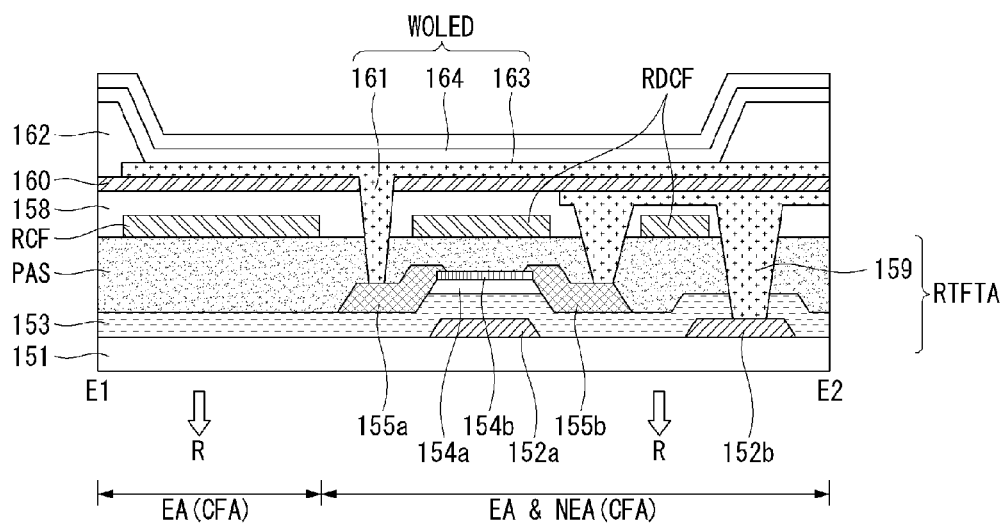
FIG. 12 is a first cross-sectional diagram of a region taken along line E1-E2 of FIG. 11.

FIG. 11 is a schematic plan layout diagram of a pixel according to a third exemplary embodiment of the present invention. FIG. 12 is a first cross-sectional diagram of a region taken along line E1-E2 of FIG. 11, and FIG. 13 is a second cross-sectional diagram of a region taken along line E1-E2 of FIG. 11.

As illustrated in FIG. 11, the third exemplary embodiment is a modification of the second exemplary embodiment. The cross-sectional structure based on the R sub-pixel RSP of FIG. 11 will be described with reference to FIG. 12. Elements previously described will be omitted for brevity.

The R color filter RCF is formed on the protection layer PAS in the opening region EA and the R dummy color filter RDCF is formed at two locations of the protection layer PAS of the light-emitting region EA & NEA. A bank layer 162 is formed on the lower electrode 161.

The bank layer 162 exposes the lower electrode 161 from the opening region EA to the light-emitting region EA & NEA. That is, in the bank layer 162, a boundary between the opening region and the light-emitting region does not exist. Here, since the bank layer 162 is formed only in the boundary between the sub-pixels, one opening is formed for each sub-pixel. However, the bank layer 162 may be omitted.

As seen in the figure and described above, the white organic light-emitting diode WOLED extends from the opening region EA to the light-emitting region EA & NEA to emit the same red R light by operation of the R transistor unit RTFTA.

In another aspect of the third embodiment, the cross-sectional structure based on the R sub-pixel RSP of FIG. 11 will be described with reference to FIG. 13.

In this aspect, a bank layer 162 is formed on the lower electrode 161. The bank layer 162 partially exposes the lower electrode 161 from the opening region EA to the light-emitting region EA & NEA. When partially exposing the light-emitting region (EA & NEA), the electrode or wiring formed at the lower portion of the R transistor unit RTFTA should be considered. Therefore, the bank layer 162 occupies the partial region in the light-emitting region EA & NEA and exposes the lower electrode 161, such that the number of the opening of the light-emitting region EA & NEA may be a n (n is integer of 1 or more).

As seen in the figure, the white organic light-emitting diode WOLED extends from the opening region EA to the light-emitting region EA & NEA to thereby emit the same red R light by the operation of the R transistor unit RTFTA.

Figure 15:
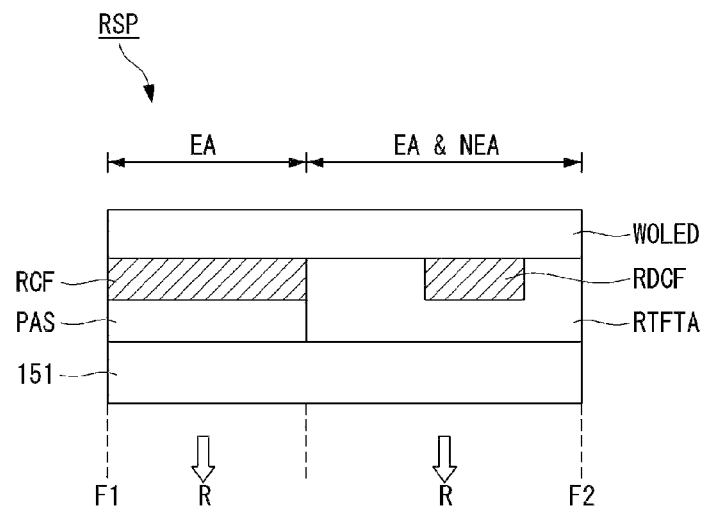
FIG. 15 is a cross-sectional diagram of a region taken along line F1-F2 of FIG. 14B.

FIG. 14A is a schematic plan diagram of a pixel according to the related art and FIG. 14B is a schematic plan diagram of a pixel according to a fourth exemplary embodiment of the present invention. FIG. 15 is a cross-sectional diagram taken along line F1-F2 of FIG. 14B.

As illustrated in FIG. 14A, the display panel according to the related art is implemented so that R, G, B, and W sub-pixels RSP, GSP, BSP, and WSP constitute one pixel. Each of the R, G, B, and W sub-pixels RSP, GSP, BSP, and WSP includes an opening region EA at an upper side and a non-opening region NEA at a lower side.

In the opening region EA, a light-emitting unit and a color filter are formed, and in the non-opening region NEA, a transistor unit is formed. The light-emitting unit emits white light and the white light is converted into red (R), green (G), and blue (B) light by the color filter. Therefore, the opening region EA may correspond to a color filter forming region CFA, and the non-opening region NEA may correspond to a color filter non-forming region NCFA. However, in the case of the W sub-pixel WSP, the white light may be emitted as it is, such that the color filter is omitted.

As illustrated in FIG. 14B, the display panel according to the fourth exemplary embodiment is implemented so that R, G, B, and W sub-pixels RSP, GSP, BSP, and WSP comprise one pixel. Each of the R, G, B, and W sub-pixels RSP, GSP, BSP, and WSP includes an opening region EA at an upper side and a light-emitting region EA & NEA in which the opening region and the non-opening region are combined at a lower side.

That is, the pixel structure as illustrated in FIG. 14B comprises one pixel using the R, G, B, and W sub-pixels RSP, GSP, BSP, and WSP as in the related art, but it is configured so that the region corresponding to the non-opening region may emit light. The red (R), the green (G), the blue (B), and the white (W) light are emitted in the light-emitting region EA & NEA of the R, G, B, and W sub-pixels RSP, GSP, BSP, and WSP, respectively.

The opening region EA of each of the R, G, B, and W sub-pixels RSP, GSP, BSP, and WSP is provided with a light-emitting unit and a color filter and the light-emitting region EA & NEA is provided with the light-emitting unit, a transistor unit, and the color filter. The light-emitting unit emits white light and the white light is converted into red (R), green (G), and blue (B) light by the color filters. Therefore, because the color filters converting the white W light into the red (R), the green (G), and the blue (B) light are required in the opening region EA and the light-emitting region EA & NEA, the opening region EA and the light-emitting region EA & NEA correspond to a color filter forming region CFA. However, a region corresponding to the W sub-pixel WSP among the light-emitting regions EA & NEA may emit the white W light as it is, such that the color filter is omitted.

Here, L2 is a length along a horizontal axis of the R, G, B, and W sub-pixels RSP, GSP, BSP, and WSP according to the fourth embodiment and corresponds to L1, a length along a horizontal axis of the R, G, B, and W sub-pixels RSP, GSP, BSP, and WSP according to the related art. However, the light-emitting region EA & NEA emits the light, such that the aperture ratio is increased, thereby making it possible to implement high-resolution.

The cross-sectional structure based on the R sub-pixel RSP of FIG. 14B will be described with reference to FIG. 15.

A protection layer PAS, an R color filter RCF, and a white organic light-emitting diode WOLED are formed on a lower substrate 151 and correspond to the opening region EA. An R transistor unit RTFTA, an R dummy color filter RDCF, and the white organic light-emitting diode WOLED are formed on a lower substrate 151 and correspond to the light-emitting region EA & NEA. As can be appreciated from the cross-section illustrated in FIG. 15, the white organic light-emitting diode WOLED extends between the light-emitting region EA & NEA and the opening region EA. In the case of the white light emitted from the white organic light-emitting diode WOLED, in the opening region EA and the light-emitting region EA & NEA, the white light may be converted into the red (R) light by the R color filter RCF and the R dummy color filter RDCF to emit the red (R) light.

Hereinafter, the fourth exemplary embodiment will be described in more detail with reference to schematic plan layout diagrams of the sub-pixels.

Figure 16:
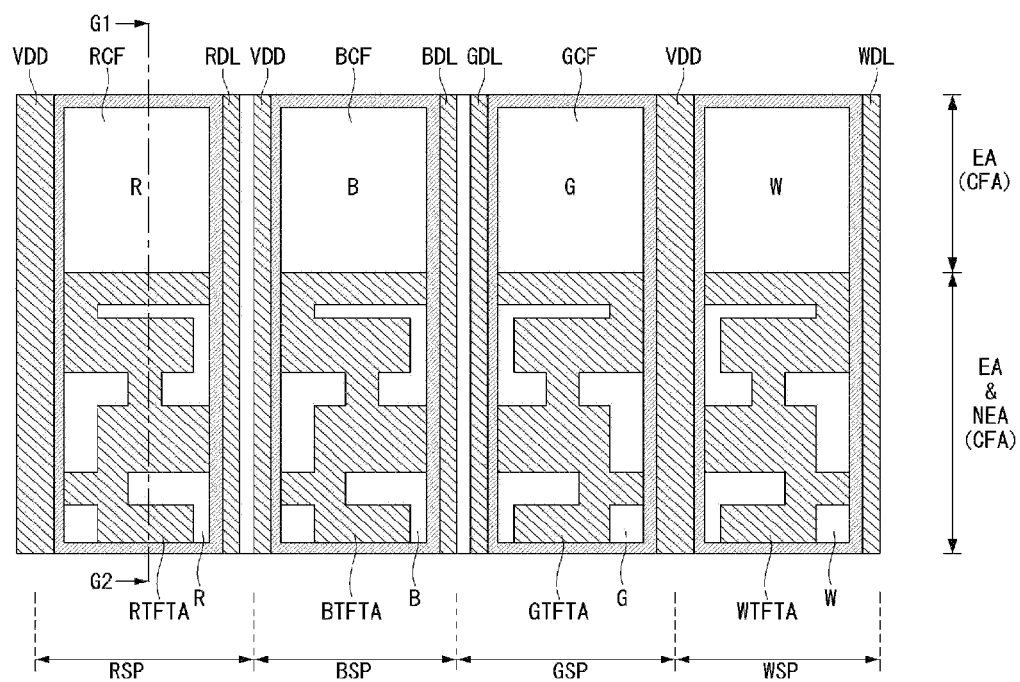
FIG. 16 is a schematic plan layout diagram of a sub-pixel according to a fourth embodiment of the present invention.
Figure 17:
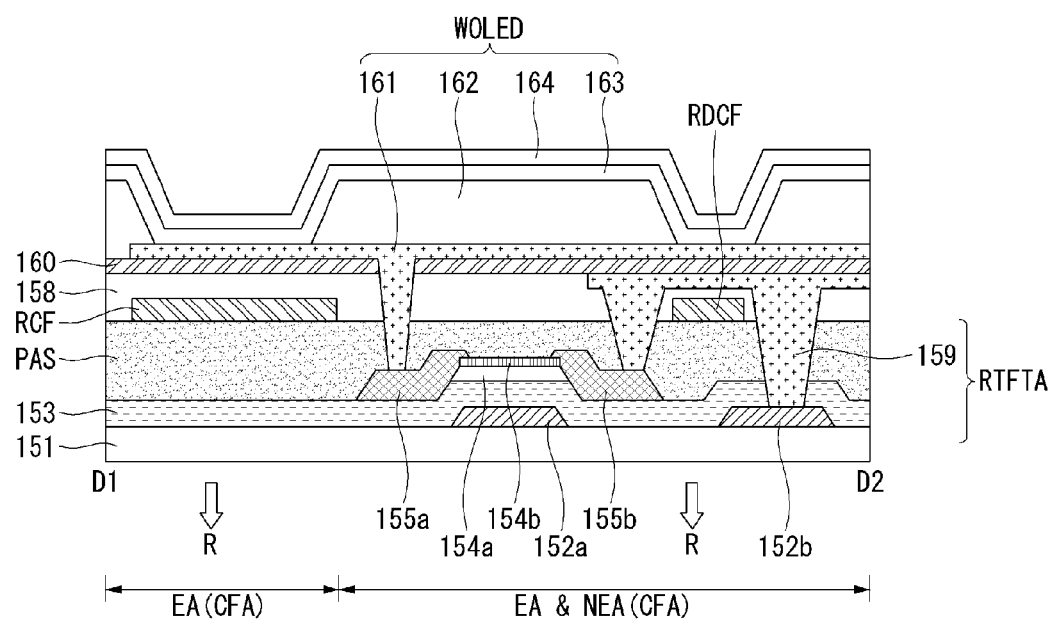
FIG. 17 is a cross-sectional diagram of a region taken along line G1-G2 of FIG. 16.

FIG. 16 is a schematic plan layout diagram of a pixel according to the fourth embodiment. FIG. 17 is a cross-sectional diagram taken along line G1-G2 of FIG. 16.

As illustrated in FIG. 16, the R sub-pixel RSP includes a power supply wiring VDD disposed at one side (e.g.: left side) and an R data line RDL at another side (e.g.: right side). The B sub-pixel BSP includes the power supply wiring VDD at one side (e.g.: left side) and a B data line BDL at another side (e.g.: right side). The G sub-pixel GSP includes a G data line GDL at one side (e.g.: left side) and the power supply wiring VDD at another side (e.g.: right side). The W sub-pixel WSP includes the power supply wiring VDD at one side (e.g.: left side) and a W data line WDL at another side (e.g.: right side). Here, a position of the power supply wiring in a structure of the R, B, G, and W sub-pixels RSP, BSP, GSP, and WSP is only an example and the position is not limited thereto.

The R, B, and G color filters RCF, BCF, and GCF are formed in the opening regions EA of the RBG sub-pixels RSP, BSP, and GSP, respectively, whereas a color filter is not formed in the W sub pixel WSP. The red (R), the blue (B), and the green (G) light is emitted in the opening regions EA of the RBG sub-pixels RSP, BSP, and GSP, respectively, and the white (W) light is emitted in the opening region EA of the W sub-pixel.

The R, B, G, and W transistor units RTFTA, BTFTA, GTFTA, and WTFTA are formed in the light-emitting regions EA & NEA of the R, B, G, and W sub-pixels RSP, BSP, GSP, and WSP, respectively. The R, B, and G second (dummy) color filters RFCF, BFCF, and GFCF are formed in the light-emitting regions EA & NEA of the R, B, and G sub-pixels RSP, BSP, and GSP, respectively, whereas a color filter is not formed in the W sub-pixel WSP.

That is, the white organic light-emitting diode WOLED formed in the light-emitting region EA & NEA extends to the opening region EA of the R, B, G, and W sub-pixels RSP, BSP, GSP, and WSP. The white organic light-emitting diode WOLED emits light corresponding to the operation of the R, B, G, and W transistor units RTFTA, BTFTA, GTFTA, and WTFTA of the R, B, G, and W sub-pixels RSP, BSP, GSP, and WSP.

In the case in which the structure of each of the R, B, G, and W sub pixels RSP, BSP, GSP, and WSP is configured as described above, when the red (R) light is emitted through the opening region EA of the R sub-pixel RSP, the light-emitting region EA & NEA also emits red (R) light. When the blue (B) light is emitted through the opening region EA of the B sub-pixel BSP, the light-emitting region EA & NEA emits blue (B) light. When the green (G) light is emitted through the opening region EA of the G sub-pixel GSP, the light-emitting region EA & NEA emits the green (G) light. And when the white (W) light is emitted through the opening region EA of the W sub-pixel WSP, the light-emitting region EA & NEA emits white (W) light.

The cross-sectional structure based on the R sub-pixel RSP of FIG. 16 will be described with reference to FIG. 17.

A gate electrode 152a and a gate metal 152b are formed on the lower substrate 151 of the light-emitting region EA & NEA. A first insulating layer 153 covers the gate electrode 152a and the gate metal 152b on the lower substrate 151. A semiconductor layer 154a is formed on the first insulating layer 153 of the light-emitting region EA & NEA and a light blocking layer 154b is formed on the semiconductor layer 154a.

A first electrode 155a and a second electrode 155b make contact with one side and the other side of the semiconductor layer 154a on the first insulating layer 153 of the light-emitting region EA & NEA. As a result, the R transistor unit RTFTA is formed on the lower substrate 151 of the light-emitting region EA & NEA.

A protection layer PAS covers the first and second electrodes 155a and 155b on the lower substrate 151. The R color filter RCF is formed on the protection layer PAS of the opening region EA and the R dummy color filter RDCF is formed on the protection layer PAS of the light-emitting region EA & NEA. A second insulating layer 158 is formed on the protection layer PAS. The second insulating layer 158 has a first contact hole exposing the second electrode 155b and the gate metal 152b of the light-emitting region EA & NEA.

A contact electrode 159 for electrically connecting the second electrode 155b to the gate metal 152b is formed on the protection layer PAS of the light-emitting region EA & NEA. A third insulating layer 160 is formed on the protection layer PAS. The third insulating layer 160 has a second contact hole exposing the first electrode 155a.

A lower electrode 161 that is electrically connected to the first electrode 155a and extends to the light-emitting region EA & NEA is formed on the third insulating layer 160 of the opening region EA. A bank layer 162 is formed on the lower electrode 161 extended from the opening region EA to the light-emitting region EA & NEA. The bank layer 162 exposes the lower electrode 161 from the opening region EA to the light-emitting region EA & NEA. That is, in the bank layer 162, a boundary between the opening region and the light-emitting region does not exist. Here, since the bank layer 162 is formed only in the boundary between the sub-pixels, only one opening is formed for each sub-pixel.

An organic light-emitting layer 163 is formed on the lower electrode 161 of the opening region EA and the light-emitting region EA & NEA. An upper electrode 164 is formed on the organic light-emitting layer 163 of the opening region EA and the light-emitting region EA & NEA. In this way, a white organic light-emitting diode WOLED is each formed in the opening region EA and the light-emitting region EA & NEA.

As seen in the description, the white organic light-emitting diode WOLED extends from the opening region EA to the light-emitting region EA & NEA to thereby emit the same red R light by the operation of the R transistor unit RTFTA.

Hereinafter, the other embodiments that may be modified based on the first to fourth embodiments described above will be described below. However, the embodiments according to the change in the structure of the lower electrode will be mainly described.

Figure 18:
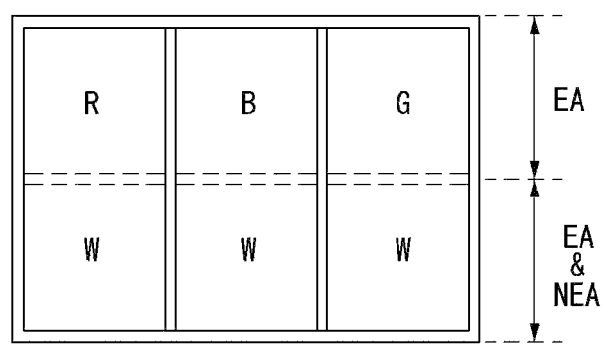
FIG. 18 is a first diagram of a lower electrode according to a fifth exemplary embodiment of the present invention.
Figure 19:
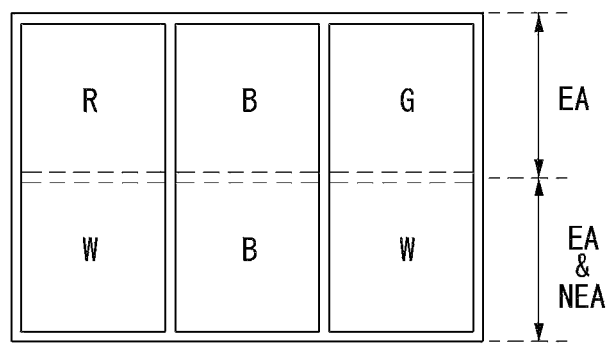
FIG. 19 is a second c diagram of a lower electrode according to a fifth embodiment of the present invention.
Figure 20:
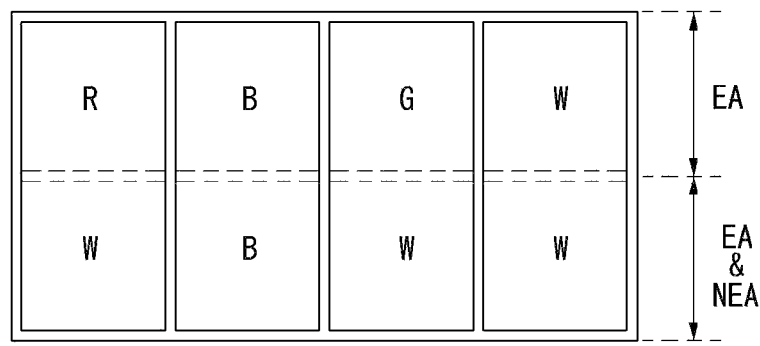
FIG. 20 is a third diagram of a lower electrode according to a fifth embodiment of the present invention.
Figure 21:
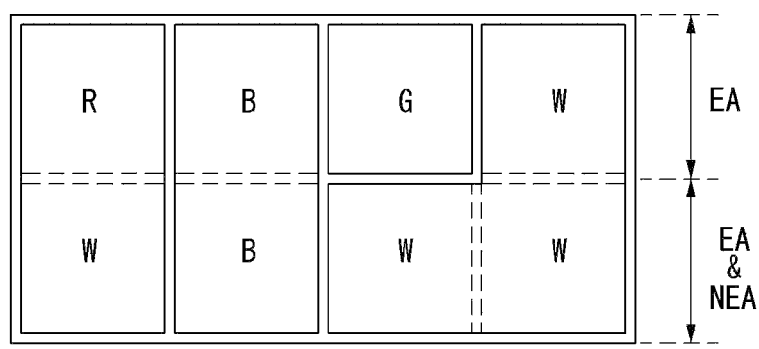
FIG. 21 is a fourth diagram of a lower electrode according to a fifth embodiment of the present invention.

FIG. 18 is a diagram of a lower electrode according to one aspect of a fifth exemplary embodiment of the present invention. FIG. 19 is a diagram of a lower electrode according to a second aspect of the fifth embodiment. FIG. 20 is a diagram of a lower electrode according to a third aspect of the fifth embodiment. And FIG. 21 is a configuration diagram of a lower electrode according to a fourth aspect of the fifth embodiment.

As illustrated in FIG. 18, a display panel is configured so that R, B, and G sub-pixels are included in one pixel. Each of the R, B, and G sub-pixels includes an opening region EA at an upper side and a light-emitting region EA & NEA at a lower side.

A lower electrode of the R, B, and G sub-pixel extends from the opening region EA to the light-emitting region EA & NEA. The opening region EA of the R, B, and G sub-pixel is provided with an R color filter, a B color filter, and a G color filter. However, the light-emitting region EA & NEA of the R, B, and G sub-pixel is not provided with any color filter.

The R, B, and G sub-pixels include a white organic light-emitting diode, such that the opening region EA in which the R color filter, the G color filter, and the B color filter are included emits red (R), green (G), and blue (B) light, respectively, and the light-emitting region EA & NEA emits white (W) light.

As illustrated in FIG. 19, a display panel is configured so that R, B, and G sub-pixels are included in one pixel, similar to the configuration of FIG. 18. However, a second (dummy) color filter is included in a portion of the opening region EA among the R, B, and G sub-pixels and a color filter is not included in a portion of the light-emitting region EA & NEA.

In this aspect, the light-emitting regions EA & NEA of the R and G sub-pixels emit white (W) light and the light-emitting region EA & NEA of the B sub-pixel emits blue B light.

As illustrated in FIG. 20, a display panel is implemented so that R, B, G, and W sub-pixels are included in one pixel and the RBG sub-pixels are configured as discussed with respect to FIG. 18 The R, B, G, and W sub-pixels are implemented base on a white organic light-emitting diode, such that the opening region EA in which the R color filter, the B color filter, and the G color filter are included emits red R, green G, and blue B lights, whereas the opening region EA and the light-emitting, region EA & NEA of the W sub-pixel in which the color filter is not included emit white W light.

In another aspect of the embodiment, as illustrated in FIG. 21, a portion of the extended lower electrode extends to the light-emitting region EA & NEA of the adjacent sub-pixel. In other words, the portion of the lower electrode of the W sub-pixel is integrated with its own light-emitting region EA & NEA and includes the light-emitting region EA & NEA of the adjacent sub-pixel.

Figure 22:
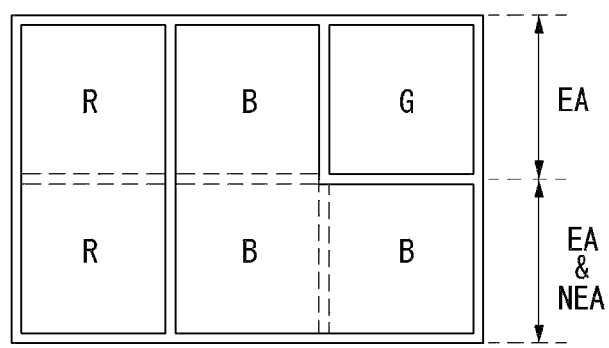
FIG. 22 is a first diagram of a lower electrode according to a sixth exemplary embodiment of the present invention.
Figure 23:
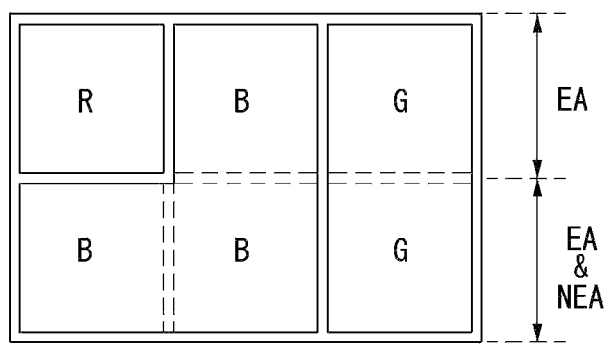
FIG. 23 is a second diagram of a lower electrode according to a sixth embodiment of the present invention.
Figure 24:
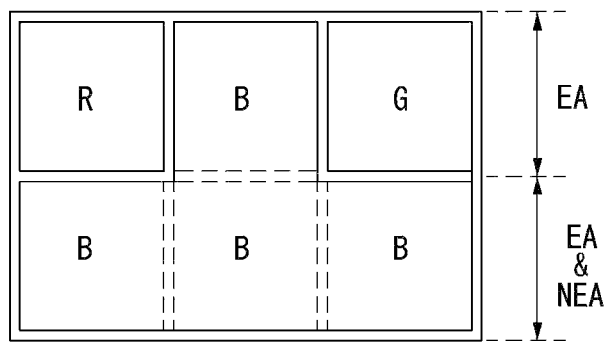
FIG. 24 is a third diagram of a lower electrode according to a sixth embodiment of the present invention.
Figure 25:
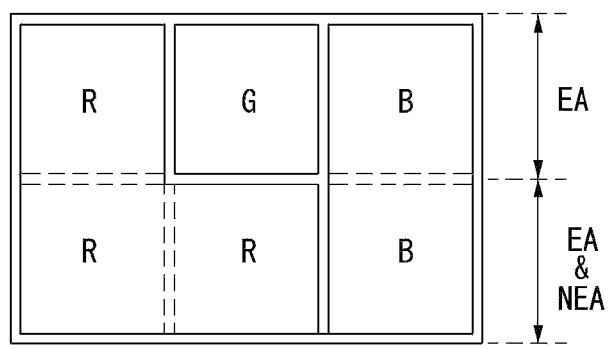
FIG. 25 is a fourth diagram of a lower electrode according to a sixth embodiment of the present invention.

FIG. 22 is a diagram of a first aspect of a lower electrode according to a sixth exemplary embodiment of the present invention. FIG. 23 is a diagram of a second aspect of a lower electrode according to the sixth embodiment. FIG. 24 is a diagram of a third aspect of a lower electrode according to the sixth embodiment. And FIG. 25 is a diagram of a fourth aspect of a lower electrode according to the sixth embodiment.

As illustrated in FIGS. 22 and 23, a display panel is configured so that R, B, and G sub-pixels are included in one pixel. Each of the R, B, and G sub-pixels includes an opening region EA at an upper side and a light-emitting region EA & NEA at a lower side.

A portion of a lower electrode of the R, B, and G sub-pixels is similar to that previously described.

Here, each of the light-emitting regions EA & NEA of the R, B, and G sub-pixels is provided with one of an R dummy color filter, a B dummy color filter, and a G dummy color filter. However, one of the light-emitting regions EA & NEA of the R, B, and G sub-pixels may be not provided with the dummy color filter.

As illustrated in FIG. 22, the R, B, and G sub-pixels include a white organic light-emitting diode, such that the opening region EA in which the R color filter, the B color filter, and the G color filter are included emit red (r), green (G), and blue (B) light, and the light-emitting region EA & NEA in which the R dummy color filter and the B dummy color filter are included emit the red (R) and the blue (B) light, respectively.

Here, the light-emitting region EA & NEA of the G sub-pixel is integrated with the light-emitting region EA & NEA of the B sub-pixel and the integrated light-emitting region EA & NEA emits blue (B) light. Therefore, the G sub-pixel has the smallest light-emitting region and the B sub pixel has the largest light-emitting region. Here, the R sub-pixel emits the light in an I-shape, the B sub-pixel emits light in an L-shape, and the G sub-pixel emits light in a square shape.

As illustrated in FIG. 23, the R, B, and G sub-pixels include a white organic light-emitting diode, such that each of the opening regions EA in which the R color filter, the B color filter, and the G color filter are included emits red (R), blue (B), and green (G) light, and the light-emitting region EA & NEA in which the B dummy color filter and the G dummy color filter are included emit blue (B) and green (G) light, respectively.

The light-emitting region EA & NEA of the R sub-pixel is integrated with the light-emitting region EA & NEA of the B sub-pixel and the integrated light-emitting region EA & NEA emits blue (B) light. Therefore, the R sub-pixel has the smallest light-emitting region and the B sub pixel has the largest light-emitting region. Here, the R sub-pixel emits light in a square shape, the B sub-pixel emits light in an L-shape, and the G sub-pixel emits light in an I-shape.

As illustrated in FIG. 24, the R, B, and G sub-pixels include a white organic light-emitting diode, such that each of the opening regions EA in which the R color filter, the B color filter, and the G color filter are included emits red (R), blue (B), and green (G) light and the light-emitting region EA & NEA in which the B dummy color filter is included emits blue (B) light.

The light-emitting regions EA & NEA of the R and G sub-pixels are integrated with the light-emitting region EA & NEA of the B sub-pixel and the integrated light-emitting region EA & NEA emits blue B light. Therefore, each of the R and G sub-pixels has the small light-emitting region and the B sub pixel has the largest light-emitting region. Here, each of the R and G sub-pixels emits the light in a square shape and the B sub-pixel emits light in an upside down T-shape.

As illustrated in FIG. 25, the R, B, and G sub-pixels include a white organic light-emitting diode, such that the opening region EA in which the R color filter, the G color filter, and the B color filter are included emit red (R), green (G), and blue (B) light and the light-emitting region EA & NEA in which the R and the B dummy color filters are included emit red (R) and blue (B) light, respectively.

Here, the light-emitting region EA & NEA of the G sub-pixel is integrated with the light-emitting region EA & NEA of the R sub-pixel and the integrated light-emitting region EA & NEA emits red R light. Therefore, the G sub-pixel has the smallest light-emitting region and the R sub pixel has the largest light-emitting region. Here, the G sub-pixel emits light in a square shape, the B sub-pixel emits light in an L-shape, and the R sub-pixel emits light in an I-shape.

As set forth above, the sub-pixels may be disposed in the RBG or RGB structure and the light-emitting region EA & NEA may emit the light corresponding to the emission color of the integrated sub-pixels. Further, the sub-pixels may emit light in one of the I-shape, the L-shape, and the T-shape.

Figure 26:
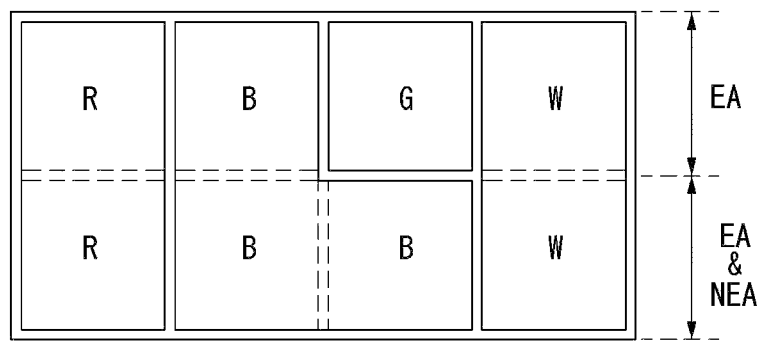
FIG. 26 is a first diagram of a lower electrode according to a seventh exemplary embodiment of the present invention.
Figure 27:
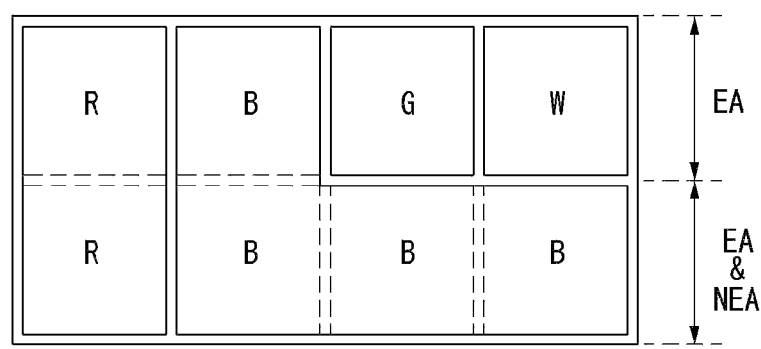
FIG. 27 is a second diagram of a lower electrode according to a seventh embodiment of the present invention.
Figure 28:
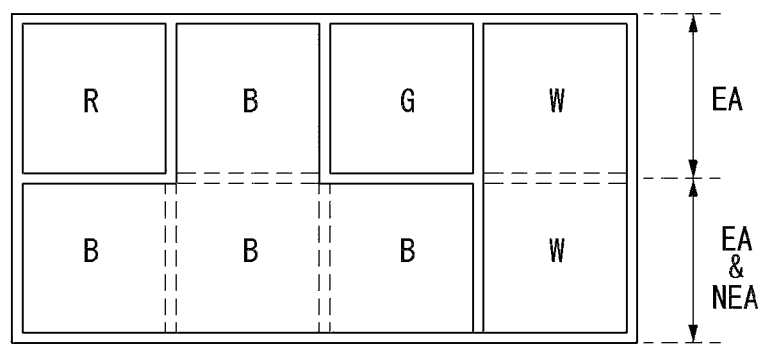
FIG. 28 is a third diagram of a lower electrode according to a seventh embodiment of the present invention.
Figure 29:
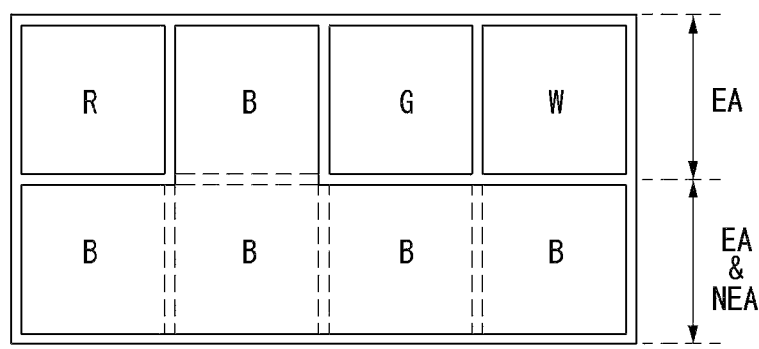
FIG. 29 is a fourth diagram of a lower electrode according to a seventh embodiment of the present invention.
Figure 30:
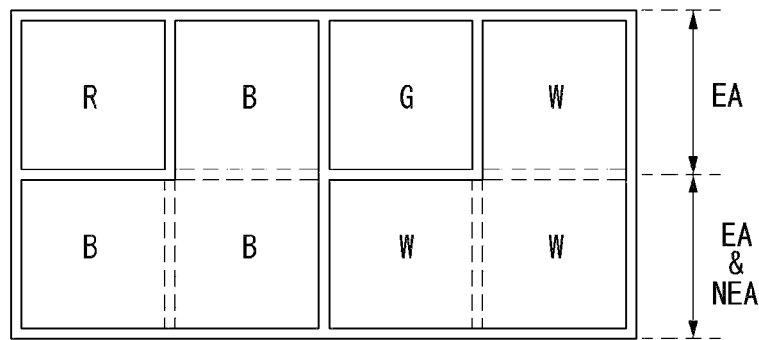
FIG. 30 is a fifth diagram of a lower electrode according to a seventh embodiment of the present invention.

FIG. 26 is a diagram of a lower electrode according to a first aspect of a seventh exemplary embodiment of the present invention. FIG. 27 is a diagram of a second aspect of a lower electrode according to the seventh embodiment. FIG. 28 is a diagram of a third aspect of a lower electrode according to the seventh embodiment. FIG. 29 is a diagram of a fourth aspect of a lower electrode according to the seventh embodiment. And FIG. 30 is a diagram of a fifth aspect of a lower electrode according to the seventh embodiment.

As illustrated in FIGS. 26 to 30, a display panel is implemented so that R, B, G, and W sub-pixels are included in one pixel. Each of the R, B, G, and W sub-pixels includes an opening region EA at an upper side and a light-emitting region EA & NEA at a lower side.

A portion of a lower electrode of the R, B, G, and W sub-pixels is extended from the opening region EA to the light-emitting region EA & NEA and a portion of the extended lower electrode extends to one or more light-emitting regions EA & NEA of the sub-pixel adjacent thereto. In other words, the portion of the lower electrode of the R, B, G, and W sub-pixels is integrated with its own light-emitting region EA & NEA as well as the light-emitting region EA & NEA of the sub-pixel adjacent thereto.

The R, B, G, and W sub-pixels include red, blue, green, and white light-emitting diodes emitting red R, blue B, green G, and white W light, respectively by themselves or based on a white organic light-emitting diode requiring the R color filter, the B color filter, and the G color filter. Hereinafter, it will be described as an example that the R, B, G, and W sub-pixels include a white organic light-emitting diode.

Each of the opening regions EA of the R, B, and G sub-pixels includes an R color filter, a B color filter, and a G color filter. Each of the light-emitting regions EA & NEA of the R, B, and G sub-pixels includes one of an R dummy color filter, a B dummy color filter, and a G dummy color filter. However, one of the light-emitting regions EA & NEA of the R, B, and G sub-pixels may be not provided with any dummy color filter.

As illustrated in FIG. 26, the R, B, G, and W sub-pixels include a white organic light-emitting diode, such that the opening region EA in which the R color filter, the B color filter, and the G color filter are included emit red (R), blue (B), and green (G) light. The light-emitting region EA & NEA in which the R and the B dummy color filters are included emit red (R) and blue (B) light. Also, the W sub-pixel is not provided with a color filter or the dummy color filter and emits white (W) light.

Here, the light-emitting region EA & NEA of the G sub-pixel is integrated with the light-emitting region EA & NEA of the B sub-pixel and the integrated light-emitting region EA & NEA emits blue B light. Therefore, the G sub-pixel has the smallest light-emitting region and the B sub pixel has the largest light-emitting region. The R sub-pixel has the same light-emitting region as the W sub-pixel. Here, the R and W sub-pixels emit light in an I-shape, the B sub-pixel emits light in an L-shape, and the G sub-pixel emits light in a square shape.

As illustrated in FIG. 27, the light-emitting regions EA & NEA of the G and W sub-pixels are integrated with the light-emitting region EA & NEA of the B sub-pixel and the integrated light-emitting region EA & NEA emits blue B light. Therefore, the G and W sub-pixels have the smallest light-emitting region and the B sub-pixel has the largest light-emitting region. Here, the R sub-pixel emits light in an I-shape, the B sub-pixel emits light with an L-shape, and the G and W sub-pixels emit light in a square shape.

As illustrated in FIG. 28, the R, B, G, and W sub-pixels are implemented based on the white organic light-emitting diode, such that each of the opening regions EA in which the R color filter, the B color filter, and the G color filter are included emits red (R), blue (B), and green (G) light, respectively, and the light-emitting region EA & NEA in which the B dummy color filter is included emit blue B light. Meanwhile, the W sub-pixel is not provided with a color filter and emits white (W) light.

The light-emitting regions EA & NEA of the R and G sub-pixels are integrated with the light-emitting region EA & NEA of the B sub-pixel and the integrated light-emitting region EA & NEA emits blue (B) light. Therefore, the R and G sub-pixels have the smallest light-emitting region and the B sub-pixel has the largest light-emitting region. Here, the W sub-pixel emits light in an I-shape, the B sub-pixel emits light in a T-shape, and the R and G sub-pixels emit light in a square shape.

As illustrated in FIG. 29, the R, B, G, and W sub-pixels include a white organic light-emitting diode, such that each of the opening regions EA in which the R color filter, the B color filter, and the G color filter are included emits red (R), blue (B), and green (G) light, and the light-emitting region EA & NEA in which the B dummy color filter is included emit blue (B) light. Meanwhile, the W sub-pixel is not provided with a color filter.

The light-emitting regions EA & NEA of the R, G, and W sub-pixels are integrated with the light-emitting region EA & NEA of the B sub-pixel and emits blue (B) light. Therefore, each of the R, G, and W sub-pixels has smaller light-emitting region and the B sub pixel has the largest light-emitting region. Here, the B sub-pixel emits light in a T-shape (a length of one side is longer than the other side) and the R, G, and W sub-pixels emit light in a square shape.

As illustrated in FIG. 30, the R, B, G, and W sub-pixels include a white organic light-emitting diode, such that each of the opening regions EA in which the R color filter, the B color filter, and the G color filter are included emits red (R), blue (B), and green (G) light, respectively, and the light-emitting region EA & NEA in which the B dummy color filter is included emit blue (B) light. Here, the W sub-pixel is not provided with a color filter.

The light-emitting region EA & NEA of the R sub-pixel is integrated with the light-emitting region EA & NEA of the B sub-pixel and emits blue (B) light.

The light-emitting region EA & NEA of the G sub-pixel is integrated with the light-emitting region EA & NEA of the W sub-pixel and emits white (W) light. That is, the region integrated with the light-emitting region of the W sub-pixel may be not provided with the dummy color filter. Therefore, the R and G sub-pixels have the same smaller light-emitting region and the B and W sub-pixels have the same larger light-emitting region. Here, the B and W sub-pixels emit light with an L-shape and the R and G sub-pixels emit light in a square shape.

Hereinafter, another embodiment will be described below, the case in which the an arrangement structure of the pixel is a quad type is described, but the present invention is not limited thereto. However, the embodiments according to the change in the structure of the lower electrode will be mainly described.

Figure 31:
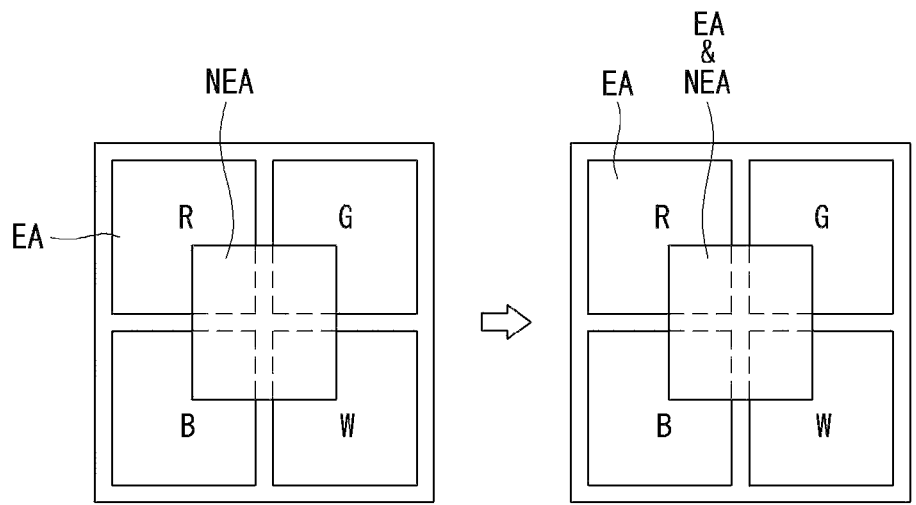
FIG. 31 illustrates a schematic plan diagram of a sub-pixel according to the related art and a schematic plan diagram of a sub-pixel according to an eighth exemplary embodiment of the present invention.
Figure 32:
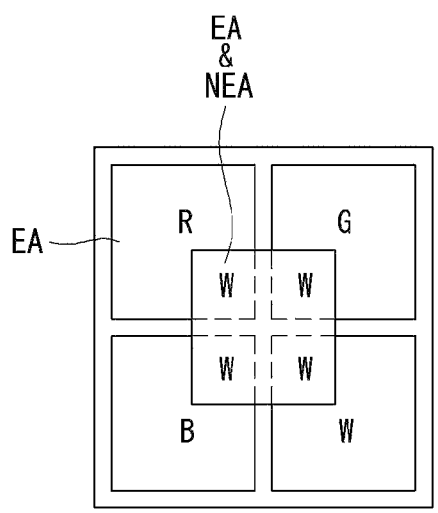
FIG. 32 is a first diagram of a lower electrode according to an eighth embodiment of the present invention.
Figure 33:
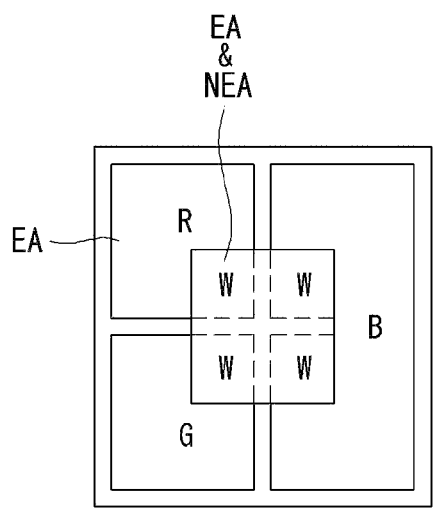
FIG. 33 is a second diagram of a lower electrode according to an eighth embodiment of the present invention.
Figure 34:
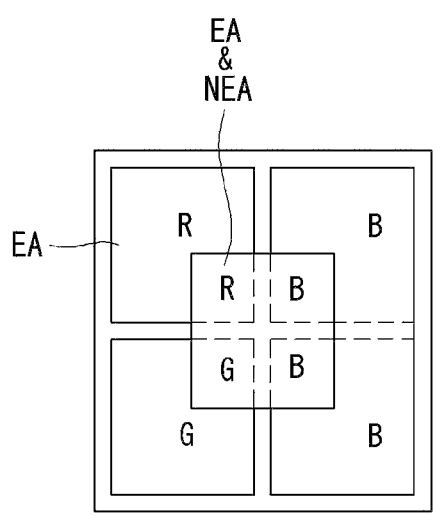
FIG. 34 is a third diagram of a lower electrode according to an eighth embodiment of the present invention.

FIG. 31 illustrates a schematic plan configuration diagram of a pixel according to the related art and a schematic plan configuration diagram of a pixel according to an eighth exemplary embodiment. FIG. 32 is a configuration diagram of a lower electrode according to a first aspect of the eighth embodiment. FIG. 33 is a configuration diagram of a lower electrode according to a second aspect of the eighth embodiment. FIG. 34 is a configuration diagram of a lower electrode according to a third aspect of the eighth embodiment.

As illustrated in FIG. 31A, the pixel according to the related art is implemented so that R, G, B, and W sub-pixels are included in one pixel. Here, the R, G, B, and W sub-pixels are arranged in a quad type. Each of the R, G, B, and W sub-pixels includes an opening region EA at an upper side and a lower side and a non-opening region NEA at a lower corner. The non-opening region NEA of the R, G, B, and W sub-pixels arranged in the quad type is at a central portion thereof.

In the opening region EA, a light-emitting unit and a color filter are formed, and in the non-opening region NEA, a transistor unit is formed. The light-emitting unit emits white light and the white light is converted into red (R), green (G), and blue (B) light by the color filters. Therefore, the opening region EA may correspond to a color filter forming region CFA, and the non-opening region NEA may correspond to a color filter non-forming region NCFA. However, in the case of the W sub-pixel WSP, the white light may be emitted as it is, such that the color filter is omitted.

The pixel structure according to the related art implements an image using the R, G, B, and W sub-pixels. However, the aperture ratio of this pixel structure according to the related art may be low and it may be difficult to implement a higher resolution.

As illustrated in FIG. 31B, the display panel according to an eighth embodiment of the present invention is includes R, G, B, and W sub-pixels in one pixel. Each of the R, G, B. and W sub-pixels includes an opening region EA at an upper side and a lower side and a light-emitting region EA & NEA in which the opening region and the non-opening region coexist with each other at a lower corner. The non-opening region NEA of the R, G, B, and W sub-pixels in the quad type is at a central portion of the pixel.

That is, the pixel structure as illustrated in FIG. 31B has one pixel using the R, G, B, and W sub-pixels and is configured so that the region corresponding to the non-opening region may emit light. Here, the light-emitting region EA & NEA emits at least one of red (R), green (G), blue (B), and white (W) light.

The opening region EA of each of the R, G, B, and W sub-pixels includes a light-emitting unit and a color filter, and the light-emitting region EA & NEA includes a light-emitting unit and a transistor unit. The light-emitting unit emits white light and the white light is converted into red (R), green (G), and blue (B) light by the color filter. Therefore, because the color filter converting the white W light is required in the opening region EA, the opening region EA corresponds to a color filter forming region. Because the white (W) light is emitted as it is in the light-emitting region EA & NEA, the light-emitting region EA & NEA corresponds to a color filter non-forming region where the color filter is omitted. However, in the case of the W sub-pixel, white light may be emitted as it is, such that the color filter is omitted.

As illustrated in FIG. 32, a pixel includes R, G, B, and W sub-pixels. Each of the R, G, B, and W sub-pixels includes an opening region EA at an upper side and a lower side and a light-emitting region EA & NEA in which the opening region and the non-opening region are combined at a lower corner.

A lower electrode of the R, G, B, and W sub-pixels extends from the opening region EA to the light-emitting region EA & NEA. Each opening region EA of the R, G, and B sub-pixels includes an R color filter, a G color filter, and a B color filter, respectively. However, the light-emitting regions EA & NEA of the R, B, G, and W sub-pixels do not include a color filter.

The R, G, B, and W sub-pixels include a white organic light-emitting diode, such that the opening region EA in which the R color filter, the G color filter, and the B color filter are included emits red (R), green (G), and blue (B) light, and the light-emitting region EA & NEA emits white (W) light.

As illustrated in FIG. 33, a pixel includes R, G, B, and W sub-pixels. Each of the R, G, B, and W sub-pixels includes an opening region EA at an upper side and a lower side and a light-emitting region EA & NEA in which the opening region and the non-opening region are combined at a lower corner. The W sub-pixel is formed as the light-emitting region EA & NEA and emits white light, such that the W sub-pixel may be defined as the dummy sub-pixel. In this configuration, the W sub-pixel is connected to separate data line and gate line in the circuit arrangement to be driven independently.

A lower electrode of the R, G, and B sub-pixels extends from the opening region EA to the light-emitting region EA & NEA. The lower electrode of the B sub-pixel extends to the size of the lower electrodes the combined R and G sub-pixels. Here, the opening region EA of the B sub-pixel extends to a size of the opening regions EA of the R and G sub-pixels. That is, the size of the B sub-pixel corresponds to the sum of the sizes of the R and G sub-pixels.

Each opening region EA of the R, G, and B sub-pixels includes an R color filter, a G color filter, and a B color filter, respectively. A portion of the opening region of the R, B, and G sub-pixels may include a second dummy color filter.

The R, B, and G sub-pixels include a white organic light-emitting diode, such that when the dummy color filter is not included in the light-emitting region EA & NEA, the opening region EA in which the R color filter, the B color filter, and the G color filter are included emit red (R), green (G), and blue (B) light. Here, the light-emitting regions EA & NEA of the R, G, and B sub-pixels emit white W light. The R and G sub-pixels emit the light in an L-shape, the B sub-pixel emits the light in a U-shape rotated 90 degrees to the left, but is not limited thereto, and the W sub-pixel emits light in a square shape.

As illustrated in FIG. 34, a pixel includes R, G, and B sub-pixels. Each of the R, G, and B sub-pixels includes an opening region EA at an upper side and a lower side and a light-emitting region EA & NEA in which the opening region and the non-opening region are combined at a lower corner.

A lower electrode of the R, G, and B sub-pixel extends from the opening region EA to the light-emitting region EA & NEA. The lower electrode of the B sub-pixel extends to be a size of the lower electrodes the combined R and G sub-pixels. Here, the opening region EA of the B sub-pixel extends to a size of the opening regions EA of the R and G sub-pixels. That is, the size of the B sub-pixel corresponds to the sum of the sizes of the R and G sub-pixels.

Each opening region EA of the R, G, and B sub-pixels includes an R color filter, a G color filter, and a B color filter, respectively. A portion of the opening region of the R, B, and G sub-pixels includes a dummy color filter.

The R, G, and B sub-pixels includes a white organic light-emitting diode, such that when the dummy color filters are included in the light-emitting region EA & NEA, the opening region EA in which the color filters are included and light-emitting region EA & NEA emit red R, green G, and blue B light. Here, each of the R and G sub-pixels emits light in a square shape and the B sub-pixel emits light in an I-shape.

In the above description of FIGS. 33 and 34, it was described that the B sub-pixel has the light-emitting area larger than that of the other R, G, and W sub-pixels. The reason is that the light-emitting efficiency or lifespan of the B sub-pixel are shorter than that of the R, G, and W sub-pixels. However, this compensates for a deficiency in the material properties, and it may be used to change characteristics of the display panel or to increase the light-emitting area of a specific sub-pixel.

The present embodiments extend the opening region to use empty space of the transistor unit as a light-emitting unit to increase the aperture ratio, making it possible to configure a display panel having a larger size and a higher resolution. In addition, the present embodiments may include the W sub-pixel with the R, G, and B sub-pixels, when changing layout as a compensation circuit, making it possible to increase the degree of freedom in designing. In addition, the present embodiments make it possible to enhance various display characteristics by changing the light-emitting area.

What is claimed is:
1. An organic light emitting display device, comprising:
a display panel including sub-pixels emitting light of at least three colors; and
a driver supplying a driving signal to the display panel,
wherein each of the sub-pixels emitting light of at least three colors include an opening region emitting its own color and a light-emitting participation region additionally emitting light of the same color or different color from the its own color.
2. The organic light emitting display device of claim 1, wherein the light-emitting participation region corresponds to a region in which a transistor unit of the sub-pixels emitting the light of at least three colors is formed.
3. The organic light emitting display device of claim 2, wherein the light-emitting participation region is included in all or in selected one or more sub-pixels emitting the light of at least three colors.
4. The organic light emitting display device of claim 2, wherein at least one of the light-emitting participation regions emits white light by an operation of a dummy transistor unit included in the light-emitting participation region.
5. The organic light emitting display device of claim 4, wherein the dummy transistor unit shares a region occupied by the transistor unit of one of the sub-pixels emitting the light of at least three colors.
6. The organic light emitting display device of claim 2, wherein the light-emitting participation region comprises an RGB dummy color filter to convert emitted light with the same color as a color of an RGB color filter of an RGB sub-pixel.
7. The organic light emitting display device of claim 2, wherein the sub-pixels emitting the light of at least three colors, including:
a lower substrate including the opening region and the light emitting participation region;
a gate electrode and a metal electrode formed on the lower substrate of the light emitting participation region;
a first insulating layer formed on the lower substrate and covering the gate electrode and the metal electrode;
a semiconductor layer formed on the first insulating layer of the light emitting participation region and positioning at a region corresponding to the gate electrode;
a first electrode and a second electrode formed on the first insulating layer and making contact with one side and the other side of the semiconductor layer;
a protection layer formed on the first insulating layer and covering the first and second electrodes;
a color filter formed on the protection layer of the opening region;
a second insulating layer formed on the protection layer and covering the color filter;
a contact electrode formed on the second insulating layer of the light emitting participation region and electrically connecting the second electrode to the metal electrode;
a third insulating layer formed on the second insulating layer and covering the contact electrode;
a lower electrode formed on the third insulating layer and electrically connected to the first electrode;
a bank layer formed on the lower electrode and exposing a portion of the lower electrode of the opening region and a portion of the lower electrode of the light emitting participation region;
an organic light emitting layer formed on the bank layer and covering the portion of the lower electrode of the opening region and the portion of the lower electrode of the light emitting participation region; and
an upper electrode covering the organic light emitting layer.
8. The organic light emitting display device of claim 7, wherein the sub-pixels emitting the light of at least three colors further include a dummy insulating layer formed on the protection layer of the light emitting participation region.
9. The organic light emitting display device of claim 7, wherein the bank layer is patterned by insulating and exposing the portion of the lower electrode of the opening region and the portion of the lower electrode of the light emitting participation region or extending from the lower electrode of the opening region to the lower electrode of the light emitting participation region to expose the extended portion.
10. The organic light emitting display device of claim 2, wherein the sub-pixels emitting the light of at least three colors are separated from each other in the opening region and the light emitting participation region or have the lower electrode extending from the opening region to the light emitting participation region.

11. The organic light emitting display device of claim 2, wherein at least one of the sub-pixels emitting the light of at least three colors includes the lower electrode extending from the opening region to the light emitting participation region.

12. The organic light emitting display device of claim 11, wherein the extended lower electrode is extended to one side to be integrated up to the light emitting participation region of the sub pixel adjacent thereto.

13. The organic light emitting display device of claim 11, wherein the extended lower electrode is extended to one side and the other side so that the light emitting participation regions of all sub-pixels included in the pixel are integrated as one.

14. The organic light emitting display device of claim 11, wherein the light emitting participation region corresponding to the extended lower electrode emits the same color or different colors.

15. The organic light emitting display device of claim 2, wherein the sub-pixels emitting the light of at least three colors emit the light with any one of braille shape, I-shape, L-shape, or T-shape depending on the emission color of the light emitting participation region.

16. The organic light emitting display device of claim 2, wherein the any one of the sub-pixels emitting the light of at least three colors has the largest light emitting area and the remaining sub-pixels have at least one same or different light emitting area.

17. The organic light emitting display device of claim 2, wherein the display panel is disposed in one of the RGB sub-pixels or RGBW sub-pixels, and one of these, a substantial light emitting area is changed depending on the emission color of the light emitting participation region.

18. The organic light emitting display device of claim 2, wherein the display panel is disposed in quad type that four sub-pixels are defined by one pixel and has the non-opening region at a central portion of the four sub-pixels.

* * * * *